United States Patent [19]

Bloy

[11] 4,457,014
[45] Jun. 26, 1984

[54] SIGNAL TRANSFER AND SYSTEM UTILIZING TRANSMISSION LINES

[75] Inventor: Graham P. Bloy, Bangkok, Thailand

[73] Assignee: Metme Communications, St. Louis, Mo.

[21] Appl. No.: 302,562

[22] PCT Filed: Aug. 26, 1981

[86] PCT No.: PCT/US81/01147
§ 371 Date: Aug. 26, 1981
§ 102(e) Date: Aug. 26, 1981

[87] PCT Pub. No.: WO83/00787
PCT Pub. Date: Mar. 3, 1983

Related U.S. Application Data

[63] Continuation-in-part of Ser. No. 265,990, Oct. 3, 1980, Pat. No. 4,368,435.

[51] Int. Cl.$^3$ .............................................. H04B 1/66
[52] U.S. Cl. ..................................... 381/98; 381/106
[58] Field of Search ................... 179/1 R, 1 D, 1 VL, 179/1 P; 328/168, 171; 333/14; 330/2, 126, 133, 278, 279, 281, 306; 381/94, 98, 103, 104, 106, 77, 80

[56] References Cited

U.S. PATENT DOCUMENTS

| | | | |
|---|---|---|---|
| 3,729,693 | 4/1973 | Dolby | 333/14 |
| 3,795,876 | 3/1974 | Takahashi et al. | 333/14 |
| 4,025,723 | 5/1977 | Blackledge | 179/1 VL |
| 4,061,874 | 12/1977 | Fricke et al. | 179/1 P |
| 4,249,042 | 2/1981 | Orban | 179/1 VL |

Primary Examiner—A. D. Pellinen
Assistant Examiner—Randall P. Myers
Attorney, Agent, or Firm—Kalish & Gilster

[57] ABSTRACT

A signal transfer and processing system for use with a transmission line includes transmission line interface circuitry (30) and signal processing circuitry (100). The processing circuitry receives a signal to be processed, providing a processed signal for further use. An input bandpass filter (119, SW7) selectively limits bandwidth the input signal. A primary active frequency control (123) selectively controls the relative level of the signal provided from the primary bandpass filter means for selectively controlling the relative level of signal dynamics within different frequency bands for providing a frequency controlled signal, which is compressed by a compressor (127). A secondary active frequency control (135) selectively controls the relative level of the primarily compressed signal within different frequency bands to provide a frequency controlled primarily compressed signal which is further compressed by a secondary compressor (137). A feedback circuit (128, 129, 140) between the primary and secondary compressors limits compression by the primary compressor as a time-delayed function of level increase of the secondarily compressed signal. An output bandpass filter (152, SW8) limits bandwidth of the secondarily compressed signal. Switching circuits (30) interconnect signal input and signal output of the signal processing circuitry with the transmission line for causing signals transmitted by the transmission line to be automatically directed through the signal processing circuitry.

23 Claims, 17 Drawing Figures

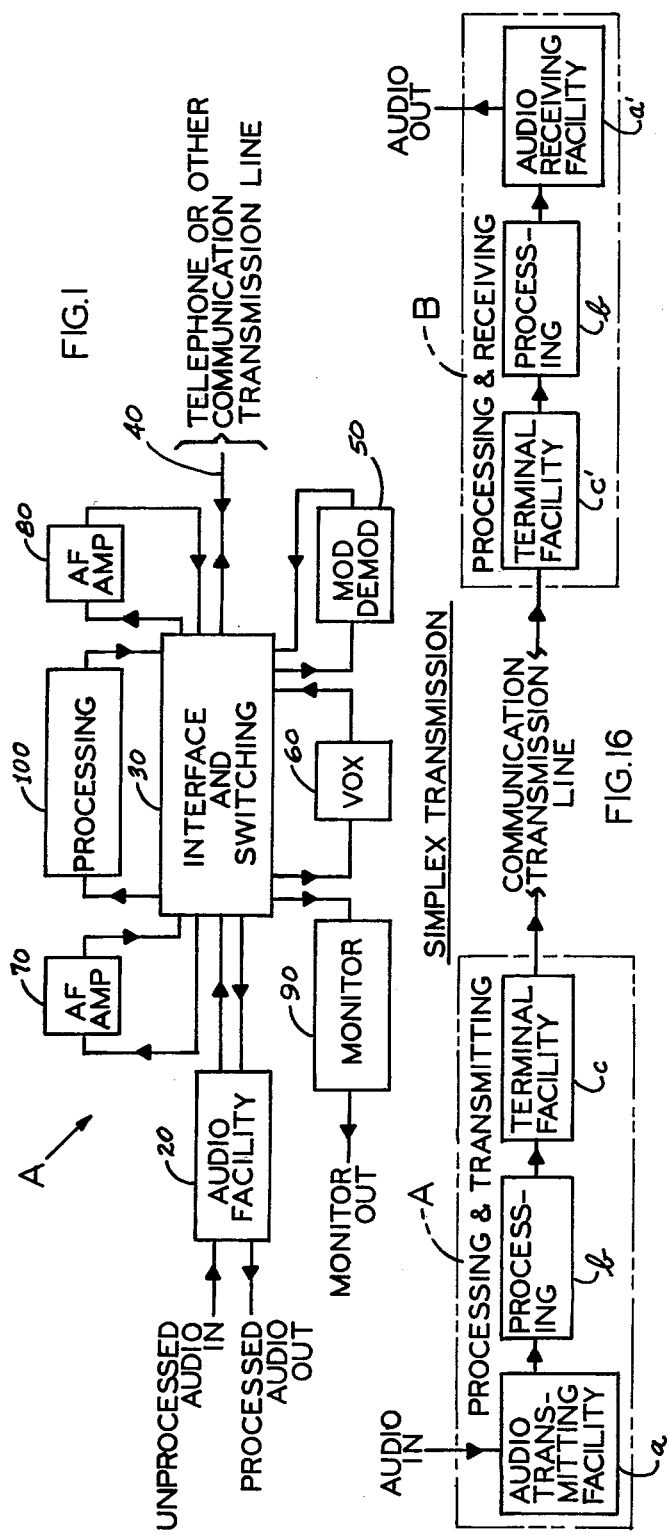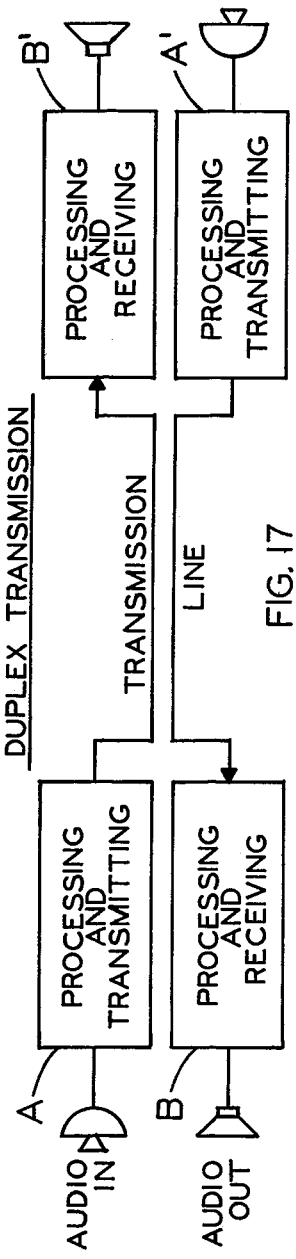

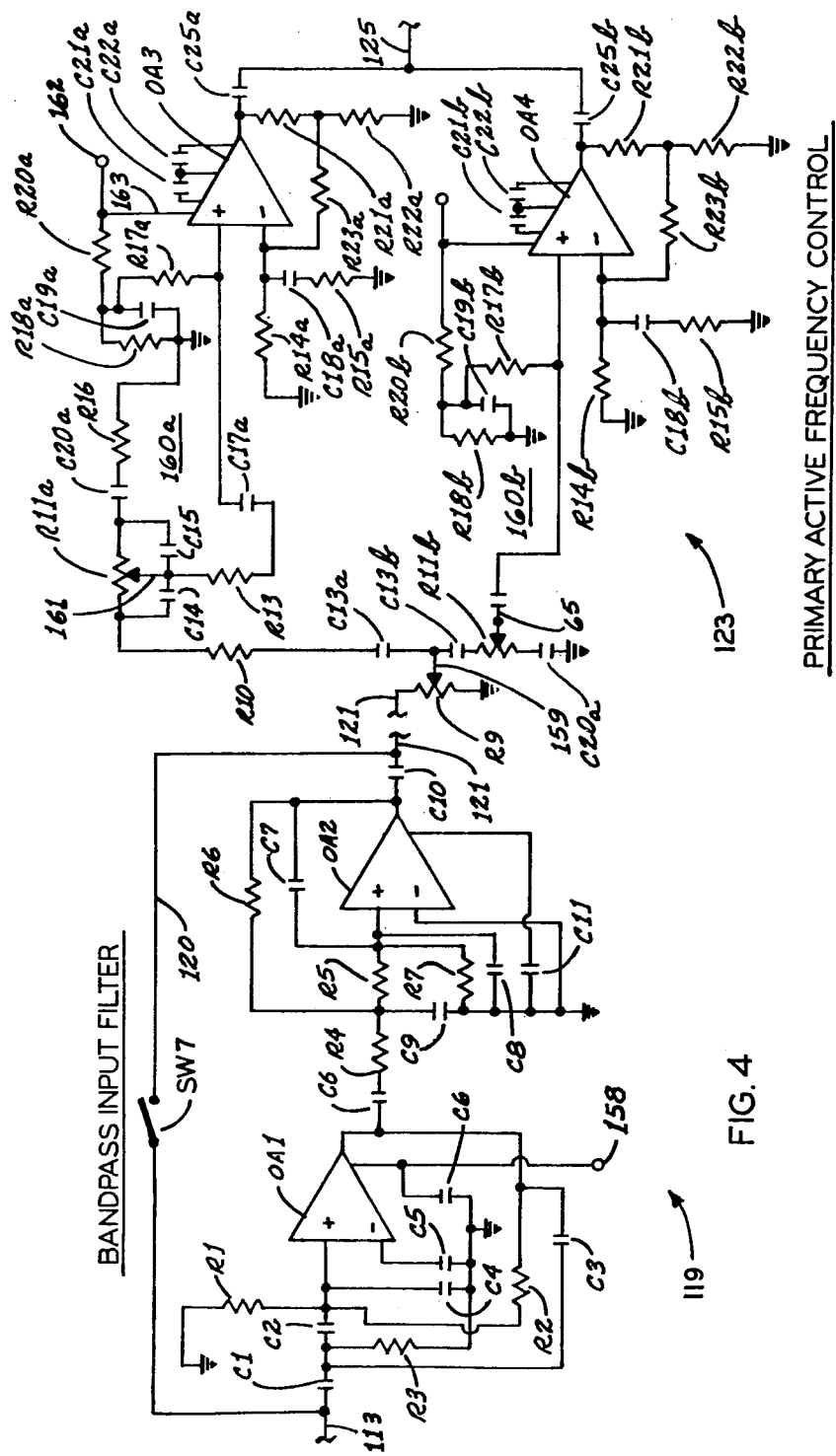

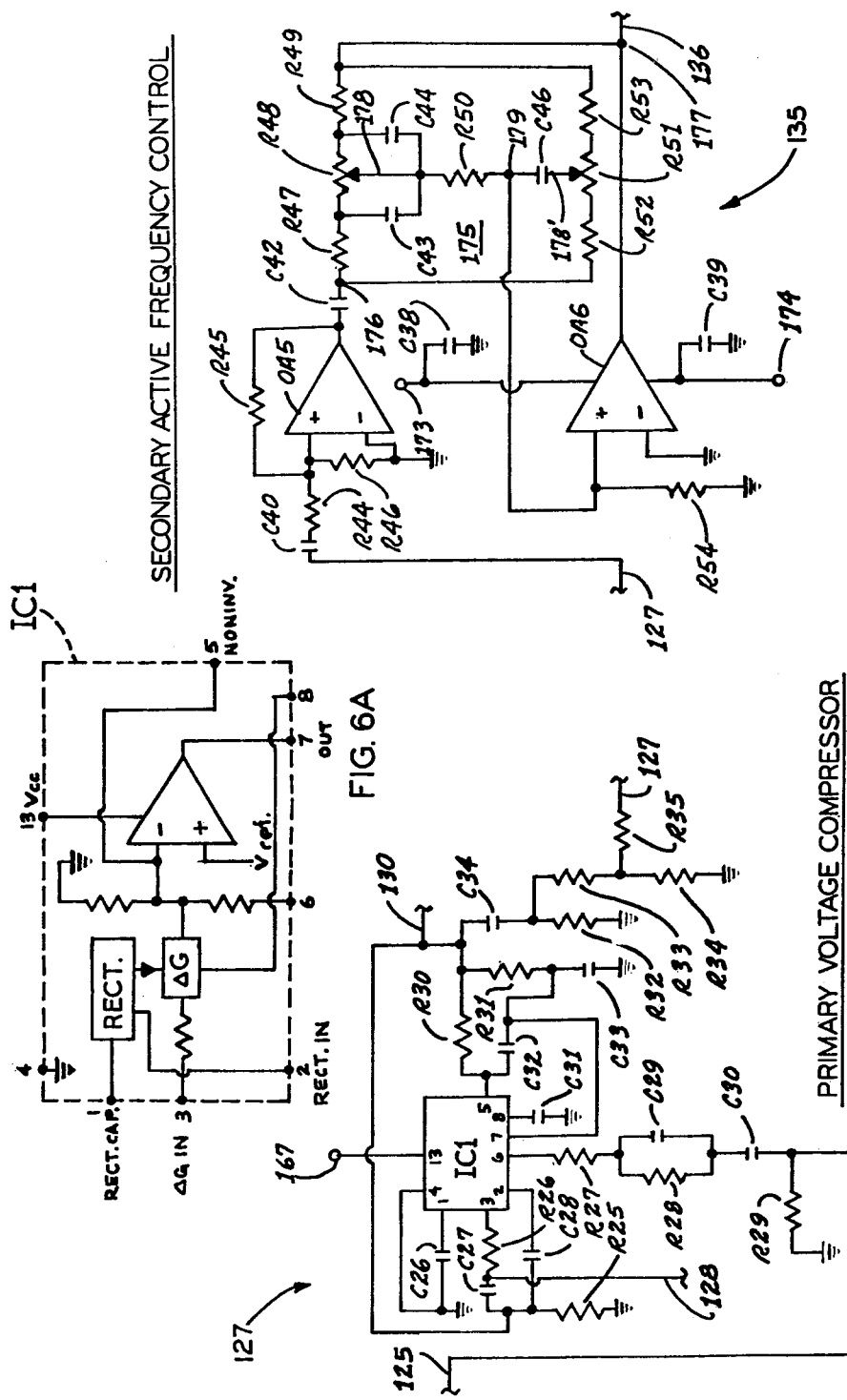

BANDPASS OUTPUT FILTER

SECONDARY DYNAMIC COMPRESSOR

ACTIVE FILTER POWER SUPPLY

AF AMPLIFIER

SIGNAL TRANSFER AND SYSTEM UTILIZING TRANSMISSION LINES

CROSS-REFERENCE TO RELATED APPLICATION

This application is a continuation-in-part of U.S. application Ser. No. 265,990, filed Oct. 3, 1980, now U.S. Pat. No. 4,368,435.

BACKGROUND AND SUMMARY OF THE INVENTION

The present invention relates to audio processing and modulation systems and, more particularly, to an improved signal processing system intended for maximizing the efficiency of line system transmission or transferring especially of audio frequency signals, as in telephony, for providing high modulation levels and for enhancing signal intelligibility and clarity while avoiding loss of audio dynamics.

In both long and short distance line signal transmission and reception of modulated signals, such as utilized in telephone and other transmission line systems utilizing any combination of various signal transmission modes, such as twisted pair, RF link, laser, fiber optics, and so forth, a major problem has always been to obtain a high level of dynamic amplitude while not only containing the full spectrum of speech harmonics but also keeping the audio bandwidth of the transmitted line signals as narrow as possible. Many modes of line transmission and types of audio or other signal modulation have been used where these matters are of great concern. Principal forms of modulation presently in use are AM, SSB, and FM. AM and FM utilize a constant carrier principal while SSB has a direct audio into power out relationship and is not a constant carrier mode of transmission when the carrier is suppressed, as is quite common.

Frequency Modulation (FM)

In constant carrier FM mode, the dynamic content of the signal and the audio bandwidth of the signal are directly proportional to the amount of deviation allowed to be imposed on the carrier. E.g., in narrow band FM transmission line systems, an audio bandwidth of 3 kcs. may be imposed. As a result, dynamic harmonics of voice characteristics are restricted and lost.

Amplitude Modulation (AM)

In the constant carrier mode of amplitude modulation, dynamics are expressed in a direct relationship with the amplitude of the constant carrier and audio frequency bandwidth being theoretically limited only by the line frequency bandwidth available. In commercial line communication systems utilizing the amplitude modulation mode of transmission, the audio bandwidth usually is restricted to eliminate spurious AM modulated pulses resulting from ignition and other electrical noise being induced on the line. An AM mode now commonly used takes the form of pulse amplitude modulation (PAM), as in teletype and data transmission systems.

Single Side Band (SSB)

The more recent mode of SSB modulation is by far the most efficient form of transmitting an audio modulated high frequency line signal. The major drawback of this mode of modulation is the extremely restricted audio bandwidth imposed resulting in extreme losses of dynamic intelligibility. However, these losses are often traded off against the high efficiency of single side band line systems.

Characteristics of Human Speech with Reference to Radio Transmission

Relative to radio transmission, attributes of human speech of concern are dynamic amplitude and harmonic relationship. The latter is extremely important in identification intelligibility.

Dynamic amplitude can be defined as the varying level of audio received by a modulation stage in any mode of modulation. The human voice is made up by a complex structure of harmonics, the main bands of harmonics falling within a 3 kHz bandwidth. A speech band-pass frequency range commonly selected is 300 Hz to 3000 Hz, and all other harmonics are generally suppressed. However, these out-of-band harmonics define voice character and, thus, intelligibility. But the suppressed harmonics fall in such a wide spectrum that if the entire speech harmonic make-up were to be transmitted, a line transmission bandwidth of some 15 kHz would be required. With modern narrow band voice line transmission systems, this would become impossible.

Consequently, speech processing has been utilized heretofore. For example, the use of band-pass frequency filters in speech line transmission systems is very common. Although speech band-pass frequencies often vary, the pass band rarely exceeds 3 kHz. This type of processing is used chiefly with narrow band audio line transmission systems. It has the advantages of being not only simple and economical to provide but also offering the expedient of limiting the power band of speech to a 3 kHz window that can be readily utilized in audio line transmission systems.

When electrically processed, signals representing human speech inevitably vary greatly in amplitude. The audio content of the transmitted signal thus varies accordingly. Yet the received audio level can only be taken as an average between the maximum and minimum dynamic amplitudes transmitted. One way of increasing the average received audio level is to use a speech compression system between the audio sound and the modulation system, resulting in a higher average level of modulation and effectively increasing the transmitted audio power. However, in increasing the lower level sequences to effectively increase the average audio content of the transmitted signal, all speech dynamics have to be sacrificed. Thus, increase in the transmitted or received audio level, after compression, must be traded off against speech intelligibility. Audio compression has been best utilized in teletype and data transmissions systems in which single frequency pulses are transmitted and dynamics are not of concern.

Circuitry providing gain control for high and low audio bands and subsequent compression of a mixed audio signal is described in Bloy U.S. patent application Ser. No. 282,051, entitled "Complete Audio Processing System", which is a continuation of application Ser. No. 59,394.

In addition to filtering and compression techniques, various other types of processing have been used in commercial line transmission systems. Where the speech input to the line modulator is not considered adequate in dynamic amplitude, simple pre-amplifier devices are often used.

Line Systems

Owing to the fact many present day line systems not only carry audio information in the form of speech but also carry digital and pulse amplitude modulated carriers, a system for interfacing audio processing circuitry with line systems should be designed to handle these various modes of line transferred information. In multiplex carrier systems, frequency modulation is also used. To accommodate these functions, interfacing should be able to prove a system contains demodulation and/or modulation for AM, FM, CW and SSB modes of transmission over a communication link.

An object of the invention is to provide a system for maximizing the efficiency of transfer of modulated signals in general and especially audio frequency energy, and particularly such a system utilizing transmission line systems.

A further object of the invention is to provide such a system useful with modulation systems.

A further object of the invention is to provide such a system for providing transfer of audio frequency signals, especially over transmission lines, in such a way that high average modulation power is attainable.

A still further object of the invention is to provide such a system for providing transfer, especially over transmission lines, of signals particularly those of audio frequency, to enhance signal intelligibility and clarity while preventing loss of dynamics.

Another object of the invention is to provide such a system which allows the processing of signals demodulated from received line transmitted signals in order to retrieve signals, particularly audio signals, with effectively high signal-to-noise ratios even where there is high noise level associated with the received line transmitted signals.

A further object of the invention is to provide such a system which can be utilized for processing of various types of signals, e.g., voice, tones, data, etc., prior to their use in modulating a line transmitted signal, as well as processing demodulated audio frequency signals upon reception of a line transmitted signal.

An additional object of the invention is the provision of such a system which is useful with various modulation systems and modulation stages to achieve maximum carrier utilization, with result in increase in effective line transmitted power and clarity.

Another object of the invention is the provision of such a system which processes audio frequency signals in such a way as to reconstitute wide frequency spectrum dynamics associated with voice and other audio frequency signals used, inter alia, for modulation of transmission lines, and which does so by recovery and amplification to audible levels of harmonics otherwise suppressed or filtered.

A related further object of the invention is the provision of such a system which permits transmission of audio signals with high average modulation levels, approaching 100% average modulation, but without customary dramatic loss of audio dynamics and intelligibility.

An object of the invention also is the provision of such a system which can be utilized in the fields of line transmission not only of speech but also high speed data, teletype, facsimile, and other modes of data communication, and when so utilized in data communication, may be advantageously part of a data communication link for reducing data drop-out.

It is also an object of the invention to provide such a system which not only is relatively simple and utilizes integrated, compact circuit components but which also is conducive to simple operation, having a minimum of useable controls that once set to the application at hand need no further adjustment.

A related further object of the invention is the provision of such a system utilizing various visual indicators for keeping the user constantly informed and aware of the extent to which signals are properly processed through the system.

An additional object of the invention is the provision of such a system which accepts substantially any low level signal within the audio frequency spectrum while according to the user the options of utilizing and emphasizing various components of the audio spectrum, and of selectively filtering and/or amplifying the input and/or output signals.

Another object of the invention is the provision of such a system in which the output of the audio signals processed through the system can be preset in amplitude to be fed to any modulation stage currently used in conventional line communication systems.

A further object of the invention is the provision of such a system which is especially of advantage in connection with narrow band VHF line transmission, making possible extraordinarily narrow band transmission containing full dynamic characteristics of audio frequency signals so processed while keeping a very high character level of modulation.

Among other objects of the invention may be noted the provision of such a system which can be utilized in connection with AM, FM, SSB, PAM, FSK (frequency shift keying), PSK (phase shift keying) and tone activated TTY line transmissions, which also can be utilized in public address application and music amplification systems.

A further object of the invention is the provision of such a system which provides interfacing with telephone lines providing impedance matching and automatic selective direction control for transmission and receiving functions.

Finally, among still other objects of the invention may be noted the provision of such a system which allows individual tailoring of harmonic response curves depending upon natural frequencies of voice signals; which allows continuous audio frequency gain control; which achieves linear tracking during audio processing; which operates to eliminate or greatly reduce third harmonic distortion; which operates to reconstitute out-of-band dynamics for allowing them to be transmitted on a narrow band signal; which makes use of solid state integrated circuit technology; which is essentially uncomplicated as well as being simple to use and maintain; which can advantageously be operated from a low voltage or battery power supplies; and which exhibits low power consumption and inherent high efficiency during operation.

Other objects and features will be in part apparent and in part pointed out hereinbelow.

Briefly, a signal transfer and processing system of the invention includes interface circuitry and processing circuitry. The processing circuitry includes a signal input for receiving signals (such as audio frequency, telephone, digital, encypted, or data signals, etc.) to be processed. These signals are supplied to a bandpass input filter and, thus filtered, to a primary active frequency control. The output of the latter drives a primary voltage compressor which selectively limits signal dynamics to a predetermined window, being controllably preset and driven with different bands of amplitude determined by the primary frequency control to maximum compression levels indicated by a visual indicator. The output of the compressor is presented to a secondary active frequency control which drives a secondary dynamic compressor with different audio bands. A second signal indicator indicates maximum compression levels of the latter. An automatic gain control tied to the latter compressor supplies feedback to the primary voltage compressor and also feeds a third visual indicator which displays compressed output voltage as well as average peak dynamic compression. The processed output of the secondary compressor is provided to a bandpass output filter and, sharply attenuated by the latter, is delivered for further use. A high level output stage is also selectively utilized. The AGC feedback signal to the primary compressor limits primary compression as a time-delayed function of increase in the level of the secondary compressor output. The primary and secondary compressors may be regarded as respective first and second dynamic control means, the primary and secondary active frequency controls as respective first and second tonal control means, since both compressors and both active frequency controls are configured for permitting selective controlling of their respective functions. The bandpass input and output filters each may be selectively switched in or out of the signal processing path. The third visual indicator may be a meter having a moving coil-type movement to provide an averaging display. The interface circuitry provides interconnection of said processing circuitry with a transmission line for causing signals transmitted over the transmission line to be automatically directed through the processing circuitry thereby to produce processing of audio frequency signals transmitted over the transmission line. The interface circuitry includes switching circuits for providing interconnection with telephone lines, for example, and for selectively switching into the system demodulators and modulators for AM, FM, CW and SSB modes of communication.

BRIEF DESCRIPTION OF THE DRAWINGS

FIG. 1 is a block diagram of a system constructed in accordance with and embodying the present invention.

FIG. 4 is a schematic circuit diagram of a bandpass input filter of the circuitry of FIG. 1.

FIG. 5 is a schematic circuit diagram of a primary active frequency control circuit of FIG. 1.

FIG. 6 is a schematic circuit diagram of a primary voltage compressor of the system of FIG. 1.

FIG. 6A is a block diagram of an integrated circuit device forming part of the primary compressor of FIG. 6.

FIG. 7 is a schematic circuit diamgram of a secondary active frequency control fo the system of FIG. 1.

FIG. 16 is a block diagram illustrating a simplex communications configuration of the invention.

FIG. 17 is a simplified block diagram illustrating duplex communications configuration of the invention.

Corresponding reference characters indicate corresponding elements throughout the several views of the drawings.

DESCRIPTION OF THE PREFERRED EMBODIMENT

General Description of System

Figure 2:
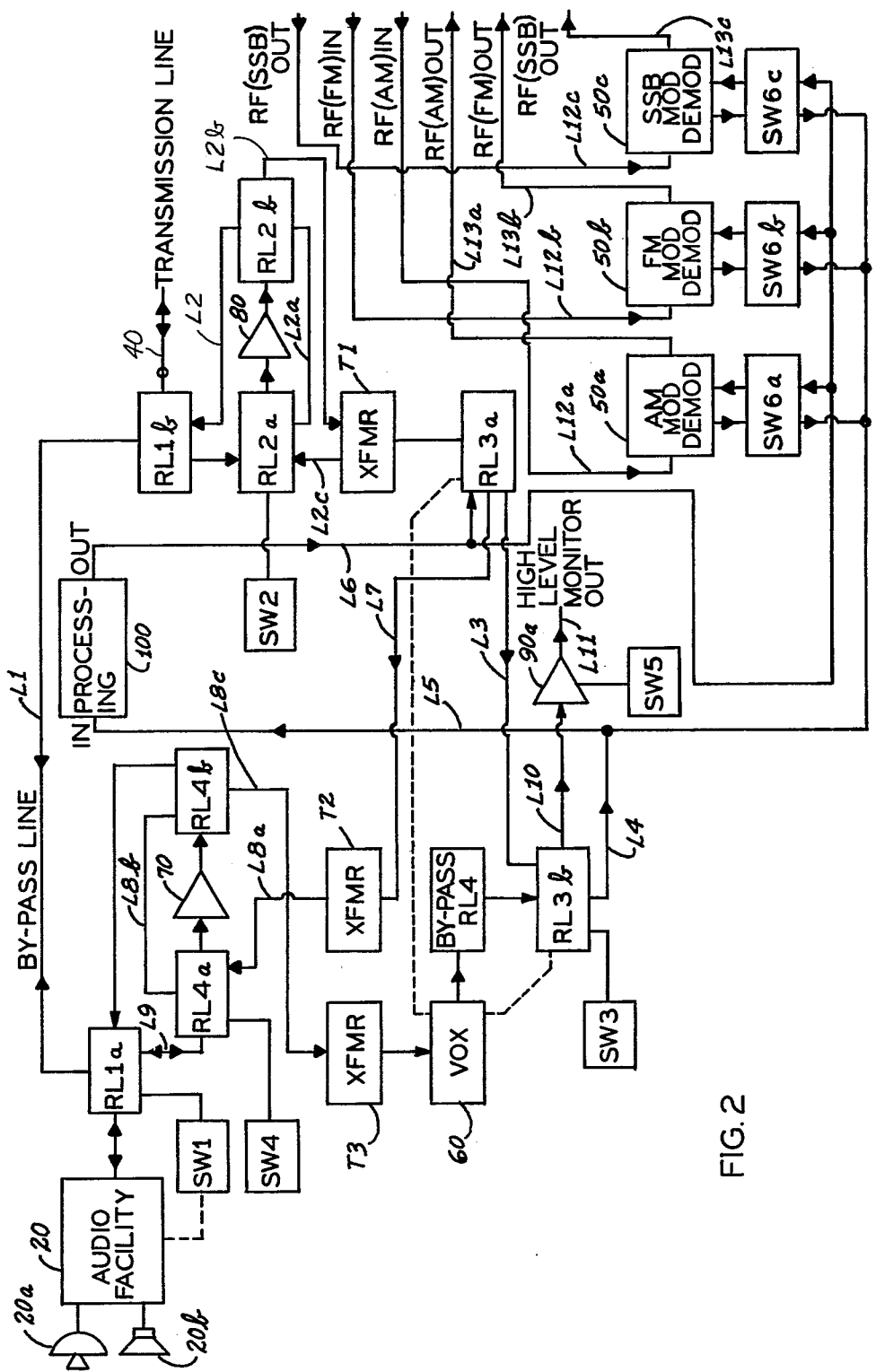
FIG. 2 is a block diagram of the system of FIG. 1 but illustrating certain features thereof in greater functional detail.

Referring now by reference characters to the drawings, reference character A is used to designate generally a system of the present invention for maximum efficient transfer of modulated audio frequency energy utilizing transmission line systems. In this sense, the term transmission line is intended to encompass any of the general class of signal-transmission line systems which either comprise conductive connections (such as twisted pairs, telephone lines, etc.) between system elements which carry signal power or which have other types of transmission line components (such as coaxial cable and waveguide, etc.) for carrying signals of various frequencies but wherein the signals are modulated or otherwise contain audio frequency information or are pulse or otherwise encoded (as by frequency shifting) with information at audio frequency rates, whatever form or mode of transmission or propagation is used.

The invention is especially useful for use with signals transmitted by telephone systems which have an assemblage of telephone stations, lines, channels, and switching arrangements for their interconnection, together with all of the accessories for providing telephone communication. Thus, in telephony, audio frequency signals are transmitted by a telephone line consisting of the conductors and circuit apparatus associated with the particular communication channel and consisting usually of a conductor pair between telephone stations and/or between such stations and a central office or offices. However, a telephone channel suitable for the transmission of telephone signals may not merely consist of conductors but comprises frequently also various other transmission media, including radio frequency links in general.

Referring to FIG. 1, 20 designates an audio facility such as a telephone transmitter and/or telephone receiver such as may constitute a telephone set, i.e., instrument, in commercial, domestic or governmental use. Facility or instrument 20 receives unprocessed audio signals as an input, such as provided by a microphone of the telephone transmitter. However, audio frequency signals provided as an input may be those supplied by any of myriad possible sources, such as the output of a conventional microphone, pre-amplifier, tape recorder, output of a modulation system or of a receiver, etc. These signals may consist of tone pulses, frequency shift keying pulses, tone encoded information, teletype signals (TTY), facsimile date, date signals, and various voice transmissions, data transmissions, etc. and may consist also of cyphered or decyphered signals having constituent components of audio frequency. In this regard, it can be said that any audio waveform that deviates from a true sine wave can be said to be constructed of related harmonics. A system of the invention provides modification of these harmonics.

Audio facility 20 also provides an output for audio signals which have been processed in accordance with the invention, these signals being derived from those received by the system and transmitted through the system to the system of said audio facility. These signals are of the same character however processed by circuitry of the invention, which are provided as an input to audio facility 20.

Audio facility 20 is interconnected with interface and switching circuitry 30. The function of circuitry 30 is more fully developed hereinbelow but it is observed at the outset that circuitry 30 is connected to, and provides interfacing with, a telephone or other communication transmission line 40. Transmission line 40 may be a line consisting of one or more conductors, or waveguide, fiber optics, cable, and any of various other transmission line components, including those associated with microwave transmission, which are utilized for the transmission of communication signals, including data, over one or more channels.

Interconnected with switching circuitry 30 is a so-called modem (modulator-demodulator) 50 representative of any of various types of modulators and/or demodulators which may be utilized for either modulating signals, including radio frequency signals, with the audio input provided to audio facility 20 to be transmitted via transmission line 40, or for demodulating incoming audio frequency signals to be provided, as processed audio output, from audio facility 20. Alternatively, modem 50 may represent circuitry for recovering data received over transmission line 40 and for suitably modulating a carrier with encoded data provided as an input to audio facility 20 for transmission by means of transmission line 40. Also indicated is a voice operated switching system or so-called "VOX" which controls operation of the system to permit processing of audio frequency signals dependent upon the direction over transmission line 40. Thus, incoming signals received over transmission line 40 may be processed but, upon the provision of unprocessed audio frequency signals to audio facility 20, VOX 60 is operative to cause circuitry 30 to enable the system for providing processing of the signals to be transmitted over transmission line 40.

Also shown interconnected with circuitry 30 are audio frequency amplifiers 70 and 80 for respectively amplifying audio signals provided to audio frequency 20 for transmission and for amplifying incoming signals to be provided by audio facility 20 as an output. Designated at 90 is a monitor circuit to provide isolation for monitoring signals before they are processed by processing circuitry designated generally 100 in accordance with the invention. Circuitry 30 operates to provide routing of unprocessed audio signals from audio facility 20 for routing through processing circuitry 100 when the signals are to be provided for transmission over transmission line 40. Similarly, incoming signals received from the transmission line are routed by circuitry 30 through the processing circuitry 100 to be provided by audio facility 20 as processed audio output. In the preferred embodiment of the invention to be described with regard to FIG. 2, VOX circuit 60 causes the interface and switching circuitry 30 to route the signals through processing circuitry 100 in accordance with whether they are incoming or outgoing with respect to transmission line 40.

Referring now to FIG. 2, circuitry of the invention is shown in block diagramatic representation. Audio facility 20, which may be a telephone set, including a telephone transmitter 20a and telephone receiver 20b, provide or receives signals from a relay RL1a which is interconnected with a counterpart relay RL1b by a bypass line L1. Relay RL1b is operated with relay RL1a under the control of a switch SW1. In this regard, various power supply connections for the operation of relays of the invention are not shown, their connection being apparent to skilled circuit designers. Relays RL1a and RL1b are thus operated by switch SW1 either to route signals to and from audio facility 20 for being transmitted or received by transmission line 40 either via bypass line L1 or through circuitry of the invention.

Features of the circuitry of FIG. 2 are best demonstrated by considering the flow of signals through the circuitry, in accordance with the invention. Unless switch SW1 is operated for permitting signals to be delivered through the bypass line, relays RL1a and RL1b route signals through circuitry to be processed by processing circuitry 100 of the invention. Thus, assuming that signals are received from transmission line 40, the same are routed by relay RL1b to a further relay RL2a controlled by a switch SW2. Relays RL2a, RL2b, being under the control of switch SW2, thus, allow selective amplification of incoming signals but are controllable to permit outgoing signals to be provided through line L2 without amplification. Switch SW2 provides manual override also to permit incoming signals to be received without amplification if desired.

Switch SW1 may be manually operated or automatically operated by the initiation of a telephone connection. In this regard, it is desired that there be no line dialing pulses to be processed by processing circuitry 100. These pulses, being DC, would be blocked by circuitry 100 and cause zero loop current on the telephone line, thus causing the telephone instrument 20 to become inoperative. Thus, relays RL1a and RL1b can provide automatic bypass switching that connects the processing circuitry 100 in line after all dialing and line connection has been achieved. Relays RL1a and RL1b may preferably provide time delayed DC switching action which allows 15 secs. for line dialing and phone line access upon which time the processing circuitry becomes an integral part of the telephone circuit. A dotted line connection of switch SW1 with audio facility conventionally reflects control over relays RL1a and RL1b by audio facility 20 for providing the foregoing functions.

Relay RL2a is operated by switch SW2 to selectively route the incoming or outgoing signals through a conventional audio frequency amplifier 80 or else through a line L2a without amplification, to a corresponding relay RL2b operated with relay RL2a and also under the control of switch SW2. Relay RL2b routes the incoming signals to an impedance matching transformer T1 through a line L2b. Outgoing signals are routed to relay RL2a, for amplification, by a line L2c from transformer T1. The latter provides impedance matching of the 600 ohm impedance, for example, of transmission line 40 to a higher impedance of nominally 50,000 ohms associated with circuitry 100. Of course, 50 ohm or 300 ohm transmission lines may be used for transmission. Thus, transformer T1 and other impedance matching transformers T2 and T3 are selected (or may have appropriate windings) for the desired impedance match.

Transformer T1 supplies the incoming signals to a further relay RL3a which, with a corresponding relay RL3b, is under the control of a manual switch SW3. Relay RL3a delivers the incoming signals via line L3 to relay RL3b and thence, via lines L4 and L5 to the input of processing circuitry 100 of the invention. Signals are processed in accordance with the operation of the processing circuitry 100 discussed hereinbelow, being provided upon an output line L6 which also is interconnected with relay RL3a. The latter routes signals provided upon output line L6 through a further line L7 to a further impedance matching transformer T2, which again provides a match between the 50,000 ohm impedance of circuitry 100 and the 600 ohm impedance associated with telephone lines. Transformer T2 provides the processed signals by a line L8a to a relay RL4a which, with a corresponding relay RL4b, both being operated by a switch SW4, permits signals to be amplified by an audio frequency amplifier 70 or else provided directly over a line L8b. A line L9 between relay RL4a and relay RL1a routes the processed received signals to audio facility 20 for being reproduced by telephone receiver 20b.

The route taken by audio signals picked up by telephone receiver 20a demonstrates still other features of the circuitry. Thus, the user at a local facility providing an audio signal to transmitter 20a has the result of producing signals by means of audio facility 20 which are delivered to relay RL1a for being routed through line L9 to relay RL4a. Depending upon the position of switch SW4, relays RL4a and RL4b permit audio frequency amplifier 70 to amplify these signals so that they are of a level adequate for being processed by circuitry 100. Or, if they are already of high level, they may be provided directed by line L8 to relay RL4b. Regardless of whether amplified or not, signals received by RL4b are made available by a line L8c to a further impedance matching transformer T3, which again may provide matching between the 600 ohm line impedance and the 50,000 ohm impedance of circuitry 100. The high impedance secondary of transformer T3 provides the output signals to the VOX circuit 60. The latter controls a relay RL4 to provide a bypass route for signals if the VOX circuit 60 senses the presence of audio signals being delivered by the secondary of transformer T3. Circuit 60 is of an entirely conventional nature such as will be understood by those skilled in the design of audio circuitry and is configured for controlling the operation of relays RL3a and RL3b. When VOX circuit 60 senses signals provided by transformer T3, thus indicating that telephone transmitter 20a is the predominant source of signals, relays RL3a and RL3b are switched to provide routing of signals as follows:

Relay RL3b supplied signals from bypass relay RL4 via line L4 to the input, via line L5 of processing circuitry 100. Similarly, line L6, providing the processed audio output signals, is connected with relay RL3a and the latter then routes signals to transformer T1 and, thence, via relays RL2a, RL2b, to relay RL1b for being delivered upon transmission line 40.

Also interconnected with relay RL3b is a line L10 which provides for the delivery of signals, prior to processing, to an RF amplifier 90a, the operation of which is controlled by a switch SW5. When enabled, amplifier 90a provides high level output via a line L11 for permitting test monitoring, recording, etc. of signals prior to being processed through circuitry 100.

Indicated at 50a, 50b and 50c are three modulator-demodulator circuits (so-called modems). These have respective outputs L12a, L12b and L12c for receiving unmodulated RF inputs of AM, FM or SSB character. These modulator-demodulators have respective outputs L13a, L13b and L13c for providing modulated outputs of AM, FM or SSB type, respectively, for delivery via transmission line, microwave, etc. Signals which are received by any of circuits 50a, 50b or 50c and which are demodulated are made available for processing in accordance with the invention. For this purpose, there are shown interconnected with the circuits respective switches SW6a, SW6b and SW6c which are each interconnected with the respective modulator-demodulator circuit 50a, 50b or 50c and also with the input line L5 of processing circuitry 100 and its output line L6. Accordingly, the demodulated signals are provided to processing circuitry 100 to be processed before being redelivered via the respective switches to the corresponding modulator-demodulator for modulation of the appropriate RF output thereof.

Therefore, it is understood that the circuitry of the invention may be used for the processing of audio frequency signals no matter whether they are transmitted via telephone or other transmission line or via radio.

Although the system demonstrated in FIG. 2 is described as having various relays, preferably the system is constructed utilizing electronic switching devices or solid state relays in lieu of mechanical relays. Therefore, a system of the invention can be constructed using conventional state-of-art logic circuitry, including microprocessors and the like, for control of switching and other operational functions.

Further understanding of the system will be had by considering the various features of the circuitry shown in block diagrammatic form in FIG. 1 and in greater detail in FIG. 2. Because an understanding of the audio processing provided by the system of the invention is critical to an understanding of the configuration and operation of the system in its entirety, the audio processing circuitry 100 is first described.

Audio Processing Circuitry

Audio frequency signals to be processed by the audio processing circuitry 100 delivered to an input 113. After being processed, the signals are delivered for further use by an ouput 115. Output signals delivered by output 115 are utilized for purposes such as the driving of a modulator, for delivery to an audio amplification stage, further audio processing or various purposes such as amplification, recording, decoding, retransmission, and so forth. An auxiliary output 117 is provided for presenting output signals at high levels such as for driving various recording devices, e.g., oscilloscopes, spectrum analyzers, and the like, without limitation.

Although signals to be processed before, or after, transmission over a line system may most typically be constituted of audio frequency information containing voice content or speech, it is emphasized that tones and tonal data of various types of an audio frequency, as alluded to hereinabove, may be processed advantageously by processing circuitry 100, such as to improve signal-to-noise ratio (S/N) and/or achieve other objects of the invention. Thus, it is to be understood that audio processing circuitry 100 is utilized for transferring audio frequency signals before or after live transmission in such a way that the efficiency of transfer is maximized or optimized by processing the signals for various purposes such as, for example, to provide high average modulation power, to enhance signal intelligibility, to provide high clarity fo signal transmission, and to avoid loss of audio dynamics, among numerous other objects hereinabove stated.

Input 113 delivers audio signals to a bandpass input filter 119 for providing filtering of frequencies to achieve a pass band of between 300 Hz and 3 kHz. Filter 119 effectively limits all other frequencies. The pass band thus achieved is merely that preferred and utilized to advantage in the operation of the present system and may be varied in accordance with the purpose intended for the present system, e.g., in having different widths and different lower and upper frequency limits. A switch SW7 connected by a circuit lead 120 between input 113 and the output 121 of filter 118 permits selective disablement of filter 119 for purposes stated hereinbelow.

The output of the bandpass input filter 119 is delivered by output connection 121 to a primary active frequency control 123. Control 123 effectively splits the audio spectrum of the signals delivered to it into two separate frequency bands. Preferably, although not necessarily, the lower band is from 250 Hz to 1.2 kHz and the upper frequency band is from 1.4 kHz to 3.5 kHz. Control 123 includes means for selectively controlling the amplitude of the audio content of each of these audio bands allowing the user either to attenuate or to provide gain in each of said bands over a preferable range of ±10 db. Also, the primary active frequency control 123 preferably incorporates an input gain control for purposes later appearing. The control components of circuit 123 also allowing individual tailoring of out-of-band harmonics which are reconstituted by processing of audio signals by circuitry 100 of the system.

Signals from control 123 are then provided by a connection 125 to a primary voltage compressor 127. The latter provides a relatively high compression range, i.e., preferably 135 db, as well as pre-emphasis of high frequency audio components to compensate for high frequency losses which otherwise could occur during processing. Compressor 127 is preferably selected to limit all audio dynamics to a 27 db window with a tracking error of not greater than about ±3 db. Included within compressor 127 is a variable gain cell which is indirectly controlled, via a lead 128, by an automatic gain control (AGC) circuit 129 described hereinbelow.

Also connected with compressor 127 by a lead 130 is an LED drive circuit 131 for driving an LED indicator 133 in accordance with the operation of compressor 127 to provide the system operator with an indication of the extent to which maximum useable compression is being provided by compressor 127.

The output of compressor 127 is delivered to a secondary active frequency control 135. This circuitry is adapted to split the now dynamically compressed audio signals into two frequency bands; there being a lower frequency band of preferably from about 300 Hz to 1.5 kHz and the upper frequency band of preferably from about 1.5 kHz to 3 kHz. Control 135 is adapted for providing gain and attenuation control within these two frequency bands variable over a range of preferably ±12 db. For this purpose, manual control means are provided for the user to selectively determine the gain or attenuation within each frequency band.

Unlike the primary active frequency control 123, control 135 is adapted for providing gain peaking and attenuation occurring about center frequencies with the respective lower and upper bands at preferably 1 kHz and 2.4 kHz. This feature allows control 135 to selectively disregard interacting, and possibly distortion-productive audio harmonics occurring within the input pass band established by input filter 119. The frequency controls within control circuit 135 may be set to provide neither attenuation nor gain so that not only would no gain or attenuation but also no distortion will be provided for the signal passing through control 135.

The output of frequency control 135 is fed to a secondary dynamic compressor 137 providing an extremely fast tracking system with extremely low tracking distortion (preferably less than about 0.1%) and accepting and providing compression of signals with a dynamic amplitude range of up to about 120 db while achieving a compression window of preferably only 50 db, yet providing a third harmonic distortion (THD) figure of less than preferably 1%. AGC circuit 129 is interconnected with circuit components of compressor 137 by a connection 140 to provide an input for AGC 129 which in turn controls primary voltage compressor 127 by circuit connection 128, thereby providing a negative AGC feedback loop for limiting the degree of primary voltage compression provided by primary compressor 127 as a time-delayed function of compression by secondary compressor 137, all as more fully explained hereinbelow. However, briefly it may be noted that the connection of AGC circuit 129 to compressor 137 provides to primary compressor 127 a d.c. reference signal derived from compression stages of compressor 137.

In effect, AGC circuit 129 by interconnection with secondary compressor 137 amplifies a tracking voltage output of the secondary compressor and delivers a voltage varying within preset parameters to a variable gain cell of primary voltage compressor 127 as a function of this tracking voltage. This is carried out for the purpose of achieving extremely high tracking stability and for limiting the third harmonic distortion while reconstituting through voltage gain via the secondary active frequency control 135 of the original audio dynamics fed to secondary dynamic compressor 137. However, reconstituting of otherwise lost audio dynamics occurs as well in other portions of the system circuitry.

Interconnected as indicated at 141 with automatic gain control 129 is a meter drive circuit 143 for driving, as indicated at 144, a meter 145 preferably of a moving coil movement type to provide averaging. The meter serves as a visual indicator for displaying not only the compressed output voltage provided by secondary dynamic compressor 137 but also average peak dynamic compression, and thus indicates the extent to which the overall capability of the audio processing circuitry 100 is being utilized.

Interconnected as indicated at 147 with the output 148 of secondary dynamic compressor 137 is an LED drive circuit 149 for driving an LED indicator 150 to indicate the degree of compression being achieved by secondary dynamic compressor 127. The output of compressor 137 is delivered to a bandpass output filter 152 for providing sharply attenuated filtering of the now processed audio signals within a preferable pass band of between 300 Hz and 3 kHz with very sharp roll-off or corners at the edges of the pass band to limit the processed audio between these upper and lower limits. Filter 152 preferably provides unity gain and has an extremely low noise figure so as to avoid introducing further noise into the now processed audio. If desired, the filtered audio signals presented at output 115 may be attenuated to provide signal levels suitable for other systems being driven by the present system. Also interconnected in a circuit 153 around filter 152 is a switch SW8 for selectively disabling the operation of filter 152 for purposes noted hereinbelow. The output of filter 152 is also provided, as indicated at 155, to an audio amplifier 156 constituting a high level output stage and providing the high level output 117 noted previously.

Figure 3:
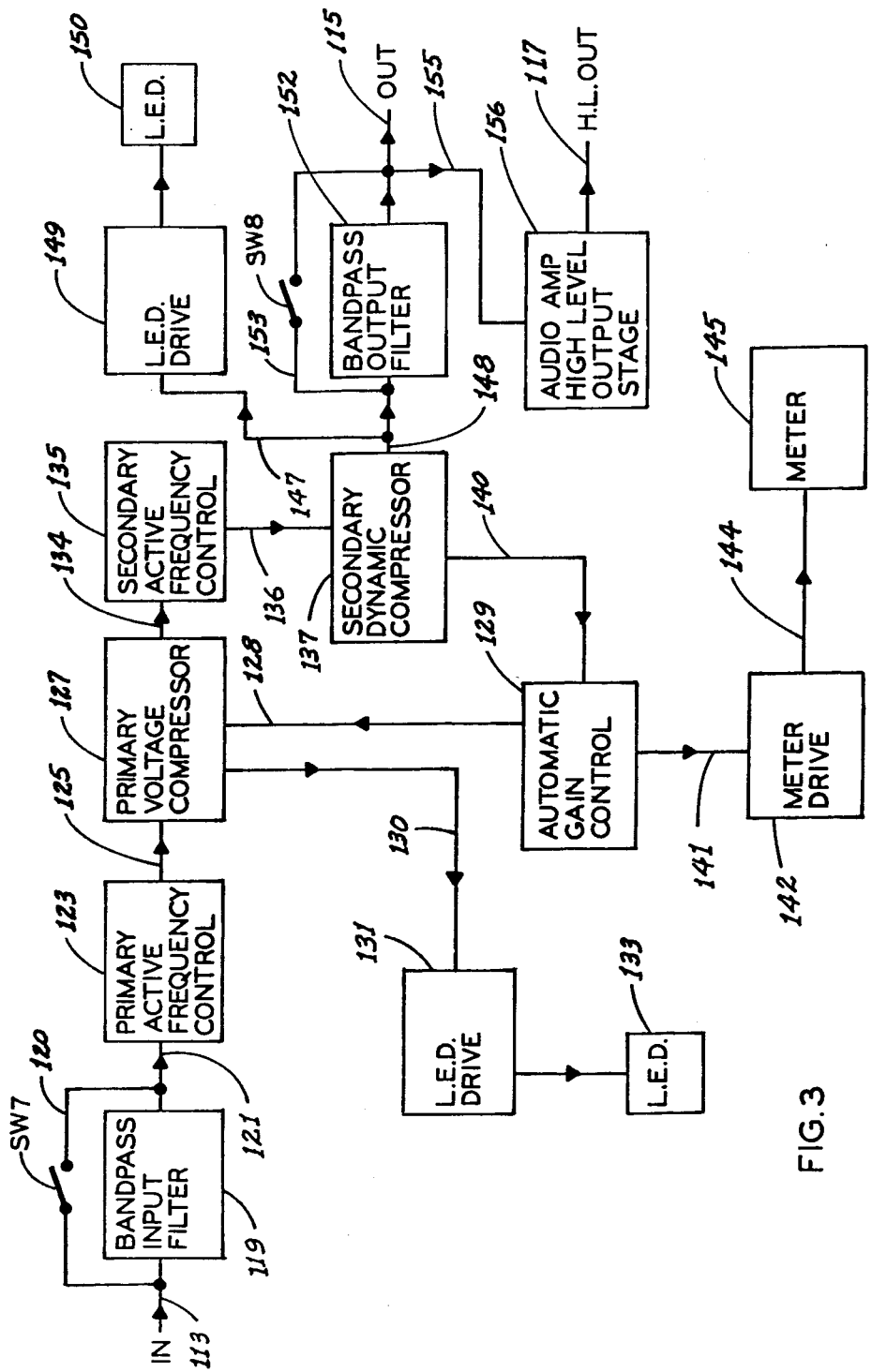
FIG. 3 is a block diagram of audio processing circuitry of the system of FIG. 1.

Now that the general circuitry of the audio processing circuitry 100 has been described, the specific circuitry of each of the blocks designated in FIG. 3 is described hereinbelow.

Generally speaking, interconnection between the individual circuitry described in FIGS. 4–13 are indicated by the alignment of leads.

Referring to FIG. 4, the circuitry of bandpass input filter 119 is seen to comprise circuit elements providing cascaded high and low frequency seasons. An operational amplifier OA1 has its non-inverting input interconnected with input terminal 113 through a pair of capacitors C1, C2 and biased to ground through a resistor R1. Feedback between the output of the amplifier and said input is provided by a circuit including a capacitor C3 and resistor R2, with capacitor C3 being connected to a node between capacitors C1 and C2 to provide capacitive feedback for tailoring frequency response. This node is also biased to ground through a resistor R3. The non-inverting and inverting inputs are connected to circuit ground through respective capacitors C4, C5. A bypass capacitor C6 conventionally connects a power supply terminal 158 to circuit ground.

The output of operational amplifier OA1 is series-connected through a capacitor C6 and resistor R4 and a further resistor R5 to the non-inverting input of a further operational amplifier OA2. Capacitive feedback between its output and its non-inverting input is provided by a capacitor C7 for frequency response control with d.c. feedback for gain control being provided by a resistor R6. It is noted that a resistor R7 and capacitor C8 are connected in parallel between the non-inverting input and circuit ground, the node common to resistors R4, R5, and R6 being ited similarly to ground through a capacitor C9, the inverting input of operational amplifier OA2 is tied directly to ground. The output of operational amplifier OA2 is provided through a capacitor C10 to output lead 121.

A conventional bypass capacitor C11 connects operation amplifier OA2 to the circuit ground. Switch SW7, which is connected by lead 120 between said input terminal 113 and lead 121 is provided so that, when it is closed, the bandpass input filter is effectively rendered inoperative, i.e., taken out of the circuit. This allows selective elimination of the bandpass input filtering under certain possible conditions of use in which it is not desired or not necessary to limit the audio signals being processed to the narrow pass band ordinarily determined by the input filter circuitry 119.

The selection of various components utilized in connection with operational amplifiers OA1, OA2 is a matter of design choice to achieve the bandpass upper and lower frequency limits referred to previously. Each of the operational amplifiers may be part of a single commercially available integrated circuit (IC) type such as LM387 exhibiting electrical characteristics and perimeters compatible with the node of intended usage of the present system and requiring power supply voltages (as delivered by terminal 158) of, e.g., ±15 v.d.c. As will be fully understood to those skilled in the art, the circuit values such as that of resistor R6 may be varied to control the gain of the bandpass input filter. But preferably filter 119 is configured to provide unity gain. It is preferred that filter 119 provide upper and lower corner frequencies of 2.7 kHz and 300 Hz, respectively, and a roll-off characteristic of −40 db. per decade, as well as very low third harmonic distortion (THD). Filter 119, providing unity gain, preferably can handle an input signal of between −35 and +10 db. without clipping or distortion.

The primary active frequency control 133 similarly utilizes two operational amplifiers OA3, OA4 for control of the amplification of the gain of individual upper and lower frequency bands. Interconnected with each of these operational amplifiers are respective resistive-capacitive circuits 160a, 160b for establishing, with respective operational amplifiers, individual circuits for providing selective amplification and control of audio frequency components within the respective audio bands.

More specifically, the input signal provided by lead 121 is delivered across a potentiometer R9 having a wiper 159 selectively variable for controlling the overall gain of stage 123. Since the two individual active frequency control circuits 160a, 160b have certain corresponding components which are connected in identical manner, corresponding elements are referred to by corresponding reference numerals with each numeral being followed by a subscript "a" or "b", as appropriate. Circuit 160a is described exemplarily. It comprises a capacitor C13a coupling the signal present on wiper 159 through a resistor R10 to a further potentiometer R11a having a wiper 161 which is selectively controllable by the user to serve as a high frequency gain control connected from opposite sides of potentiometer R11 to its wiper are capacitors C14, C15. The signal present on 161 is provided through a resistor R13 and thence through a capacitor C17a to the non-inverting input of operational amplifier OA3, which has its inverting input referenced to ground through a circuit including a resistor R14a which is in turn shunted by a series-connected capacitor C18a and resistor R15a.

The opposite end of potentiometer R11a is connected through a capacitor C20a and resistor R16 to the circuit ground. Also interconnected with the non-inverting input of operational amplifier OA3 is a frequency compensating circuit comprising resistors R17a and R18a and a capacitor C19a connected across the latter and with one end thereof being connected to circuit ground. A resistor R20a references the node between resistors R17a and R18a to the power supply potential provided to a terminal 162 for offset error compensation, said power supply potential also being provided by a lead 163 to the operational amplifier for powering same.

Negative feedback for operational amplifier OA3 is established by a voltage divider including resistors R21a and R22a and a further resistor R23a interconnecting node between the former two resistors and the inverting input of the operational amplifier. Conventional compensating capacitors C21a and C22a are connected in the typical fashion to the operational amplifier.

As thus configured, circuit 160a together with operational amplifier OA3 constitutes an active high frequency control circuit providing gain control over frequencies determined by the setting of potentiometer wiper 161, and with gain in the frequency band being variable over the range of ±12 db. within the frequency range of preferably about 1.5 kHz to 3 kHz. Gain peaking and attenuation peaking occurs oreferably about 2.4 kHz. The output of operational amplifier OA3 is provided through a capacitor C25a to output lead 125.

Similarly, circuit 160b together with operational amplifier OA4 constitutes an active low frequency control circuit providing gain control frequency over frequencies determined by the setting of a wiper 165 of potentiometer C20a, and thus determining the level of signals provided to the operational amplifier OA4 through capacitor C17b. The frequency band preferably is from 300 Hz to 1.5 kHz and with gain peaking and attenuation peaking occurring at preferably about 1 kHz. The low frequency components are provided from the output of operational amplifier OA4 through a capacitor C25b and thus delivered to output lead 125.

Preferably, although not necessarily, operational amplifiers OA3 and OA4 may both be available as a single integrated circuit (IC) such as of the commercially available type UA739, thus providing high loop gain without any substantial distortion.

The mixed high and low frequency audio components provided to lead 125 are delivered to the primary voltage compressor 127. Referring to FIG. 6, compressor 127 comprises an integrated circuit IC1 constituting a compressor-expandor or so-called compandor including a full wave rectifier, a variable gain cell and an operational amplifier including a biasing system within it, all as shown in FIG. 6A. Although a general depiction of elements thereof is represented by FIG. 6A, no specific description is necessary in view of the fact that circuit IC1 may be of commercially available form such as that designated NE570/571. But it is noted that there is an internal summing node within the operational amplifier (not shown) which is biased at a voltage preference, and signals supplied to the integrated circuit are averaged by circuitry interconnected therewith, as shown in FIG. 6. The averaged value of the input signal establishes the gain of the variable gain cell (see FIG. 6A) which is, accordingly, proportional to the average variance of the input signal capacitively coupled thereto. In any event, the operation of such circuitry is described and will be understood by reference to the above-noted pending U.S. application Ser. No. 59,394 of Graham P. Bloy, entitled "Complete Audio Processing System", filed July 20, 1979, now U.S. Pat. No. 4,400,583.

Although the gain cell of compandor circuit IC1 functions as an expandor, by providing negative feedback to the operational amplifier therein, compression is realized. Similar circuitry is utilized in secondary dynamic compressor 137 to which attention is directed, as hereinbelow described, for further understanding of the operation of primary voltage compressor 127. For present purposes, it is sufficient to observe that IC1 is interconnected as shown by pinout numerals, with the following resistive and capacitive circuit components which may have the nominal values indicated:

TABLE 1

| R25 | 100 kohm | C26 | 0.47 mfd |
| R26 | 20 kohm | C27 | 10 mfd |

TABLE 1-continued

| R27 | 20 kohm | C28 | 1 mfd |
| R28 | 120 kohm | C29 | 2700 mfd |
| R29 | 100 kohm | C30 | 1 mfd |
| R30 | 47 kohm | C31 | 2200 pfd |
| R31 | 47 kohm | C32 | 5 pfd |
| R32 | 100 kohm | C33 | 10 mfd |
| R33 | 50 kohm | C34 | 10 mfd |
| R34 | 70 kohm | | |
| R35 | 50 kohm | | |

In accordance with the invention, interconnected with the gain cell of the compandor circuit IC1 is lead 128 which provides a feedback signal of a limiting character from the automatic gain control circuit 129 as a function of the overall gain signalled by gain control circuitry 129. Here, it is observed that said lead 128 provides said AGC signal to the gain cell of compandor IC1 through resistor R26. The overall purpose and function of this negative feedback is discussed below but it is noted preliminarily that the gain cell within circuit IC1 is controlled in a negative sense in response to increase in the AGC signal supplied by lead 128, thereby to reduce the amount of primary compression achieved by stage 127 with increasing gain feedback. Thus, the feedback is essentially negative or limiting.

At 167 is indicated a terminal for supplying low voltage d.c. potential for operation of circuit IC1. As will be apparent, the dynamically compressed output signal is provided by capacitor C34 across a load resistor R32, and is appropriately attenuated by R35 for delivery through a resistor by lead 127 to the secondary active frequency control circuitry, shown in FIG. 7. However, prior to being coupled through capacitor C34, circuit lead 130 provides the compressed audio output from stage 127 to LED drive circuit 131, as disclosed in FIG. 10.

Figure 10:
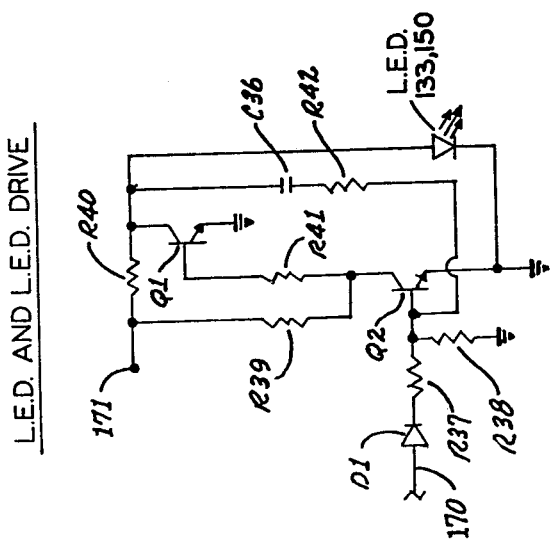
FIG. 10 is a schematic circuit diagram of an LED drive circuit including an LED indicator utilized in the system of FIG. 1.

Referring to FIG. 10, circuitry is shown for constituting the LED drive 131 and LED 133, as well as the LED drive 149 and LED 150. As shown therein, the LED indicator lamp, whether that designated at 133 or that designated at 150, is suitably mounted for being observed by the user, being driven by circuitry including a pair of NPN transistors Q1, Q2. The base of transistor Q2 is driven by a unipolar signal provided through a diode D1 and delivered through a resistor R37. The base of transistor Q1 is biased to ground through a resistor R38. Its collector is provided with a supply potential by means of a terminal 171 through a current limiting resistor R39, while a similar resistor R40 provides a supply of voltage to the collector of transistor Q1. The base of the latter is connected through a resistor R41 to the collector of transistor Q2. Coupling is provided between the collector of transistor Q1 and the base of transistor Q2 by a series connected capacitor C36 and resistor R42. Thus, there is provided a two-transistor switching circuit wherein the LED will be driven on when there is sufficient base drive provided to transistor Q2, as by the output signal of primary compressor 127 or secondary compressor.

Referring now to FIG. 7, the secondary active frequency control 135 functions to reconstitute harmonic dynamics lost in processing of the signal through primary compressor 127. Control 135 comprises a pair of operational amplifiers OA5, OA6 which are connected to provide high and low pass sections of a Butterworth filter. The operational amplifiers may each be of the commercially available type designated LM349 with both operational amplifiers being part of a single integrated circuit which is adapted for being powered by positive and negative potentials, as at 15 v.d.c., supplied to respective terminals 173, 174. Bypass capacitors C38, C39 are connected across these power supply inputs. Each of the operational amplifiers has its inverting input connected to the circuit ground. The input signal is provided by lead 127 through a capacitor C40 and resistor R44 to the non-inverting input of operational amplifier OA5. A resistor R45 interconnects the output and latter input of the operational amplifier for feedback purposes, the input being biased to ground through a further resistor R46.

The output of operational amplifier OA5 is provided through a capacitor C42 to a frequency gain control circuit 175 having two parallel branches providing at one end a node 176 constituting an input of the circuit and an opposite node 177 interconnected with the output lead 136 of frequency control circuitry. A first one of the branches comprises a resistor R47, a potentiometer R48, and further resistor R49, there being capacitors C43, C44 connected between opposite ends of potentiometer R48 and its wiper 178. The wiper is interconnected through a resistor R50 and capacitor C46 to the wiper 178 of another potentiometer R51 forming with resistors R52 and R53 in series with it a second parallel branch of circuit 175. A node 179 between resistor and capacitor C46 is connected to the non-inverting input of operational amplifier OA6, which input is biased to ground through a resistor R54. These component values are preferably selected to provide a low pass Butterworth filter defined by the following equations:

$$T(s) = \frac{sK_1'}{s + B}$$

$$T(s) = \frac{s^2 K_2'}{s^2 + 2Bs + B^2}$$

$$T(s) = \frac{s^3 K_3'}{s^3 + 2Bs^2 + 2B^2 s + B^3}$$

$$T(s) = \frac{s^4 K_4'}{s^4 + 2.613 B s^3 + 3.414 B^2 s^2 + 2.613 B^3 s + B^4}$$

For equations relating to the high pass section of the Butterworth filter, the transfer functions are as follows:

$$T(s) = \frac{s}{s + w_1}$$

$$T(s) = \frac{s^2}{s^2 + w_2 s + w_2 w_1}$$

$$T(s) = \frac{s^3}{s^3 + w_3 s^2 + w_3 w_2 s + w_3 w_2 w_1}$$

$$T(s) = \frac{s^4}{s^4 + w_4 s^3 + w_4 w_3 s^2 + w_4 w_3 w_2 s + w_4 w_3 w_2 w_1}$$

In accordance with the above design formulas, the secondary active frequency control is designed to provide tailoring of the response curve between 300 Hz and 3 kHz. The low frequency section of the circuitry of frequency control 35 is designed to control response between 250 Hz and 1200 Hz, the high frequency section being designed to control response between 1400 Hz and 3500 Hz. These figures are those preferred for various purposes contemplated for the invention but are not necessarily rigidly absolute for certain other applications, to which extent they may be subject to variation within the scope of the invention.

To provide such operation, operational amplifier OA5 acts as a buffer to ensure low driving impedance to the low and high frequency control circuits 175. The input impedance of this stage of the buffer amplifier is about 0.1 megohms. Capacitor C40 and resistor R44 provide d.c. blocking and impedance matching for the input of operational amplifier OA5. Resistor R45 provides a feedback path between the output and the non-inverting input of this operational amplifier. Capacitor C42 provides d.c. blocking of the output of the operational amplifier. High frequency control elements comprise resistors R50, R52, and R53. Potentiometer R51 allows the high frequency section of the filter to be set between preferably 0 and 22 db gain. The low frequency section comprises resistors R47, R49 and potentiometer R48, as well as capacitors C43, C44. Potentiometer R48 allows low frequency control preferably between 0 and 22 db gain.

In effect, node 179 represents the output of the frequency control circuitry 175, being this supplied to the non-inverting input of operational amplifier OA6, which acts as the active element within this active frequency control circuitry. A feedback path is provided by the interconnection with node 177 because of the interconnection with resistors R49, R53. Capacitors C40, C42 provide not only d.c. blocking but establish low frequency roll-off of the circuitry.

Although integrated devices other than the type LM349 noted above may be utilized, it is preferred that any integrated operational amplifier substituted have a fast slew rate such as better than 2.5 v. per micro second allowing undistorted full swing performance up to a frequency of 25 kHz. Also, the total harmonic distortion is preferably kept low being typically not greater than 0.05% [0 dbm (i.G.) 0.77 v.] across the complete audio spectrum. In this regard, resistor R46 ensures stability at unity gain as the integrated circuit operational amplifiers are internally compensated for positive gains of five or greater, in the case of the LM349 integrated circuit.

Chosen design specifications are preferably such that the low frequency section of the secondary active filter circuitry has a gain of 22 db with a low frequency lower 3 db corner at 30 Hz and with a high frequency upper 3 db corner at 10 kHz. As referred to hereinabove, the term corner or corner frequency refers to cut-off frequency conventionally representing 3 db insertion loss of the respective circuit.

Figure 12:
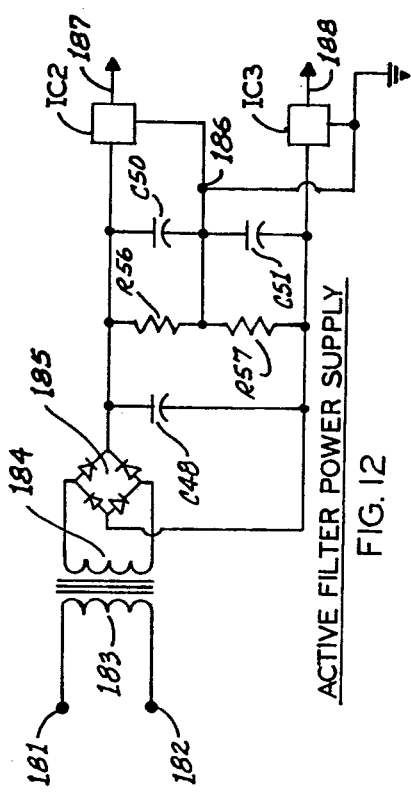
FIG. 12 is a schematic circuit diagram of an active filter power supply utilized in the system of FIG. 1.

Circuitry for providing regulated potentials suitable for the operational amplifiers fo the secondary active frequency control 135 is illustrated in FIG. 12. In the circuitry shown therein, a pair of terminals 181, 182 provide a.c. line voltage across the primary winding 183 of a transformer having its secondary winding 184 connected across a full wave bridge rectifier 185. Connected across the latter is a first filtering or a.c. decoupling capacitor C48. Across this is connected a pair of resistors R56, R57 which in turn each have connected across them capacitors C50, C51 whereby there is provided a floating ground node 186 intermediate these capacitors. Node 186 is connected to the circuit ground. The potentials on the opposite sides of each of capacitors C50, C51 are provided to respective integrated circuits IC2, IC3, such as each of commercially available type UA7815 integrated circuit regulators. Each such integrated circuit is connected also to the circuit ground and each provides a respective output 187, 188 to provide highly regulated voltages, preferably, +15 v.d.c. and −15 v.d.c. for powering operational amplifiers OA5, OA6 of the secondary active frequency control and others with a voltage stability of within ±1%.

Similar circuitry may be utilized for developing other supply potentials for operation of other components of this system. Alternatively, battery power supplies may be utilized.

Figure 8:
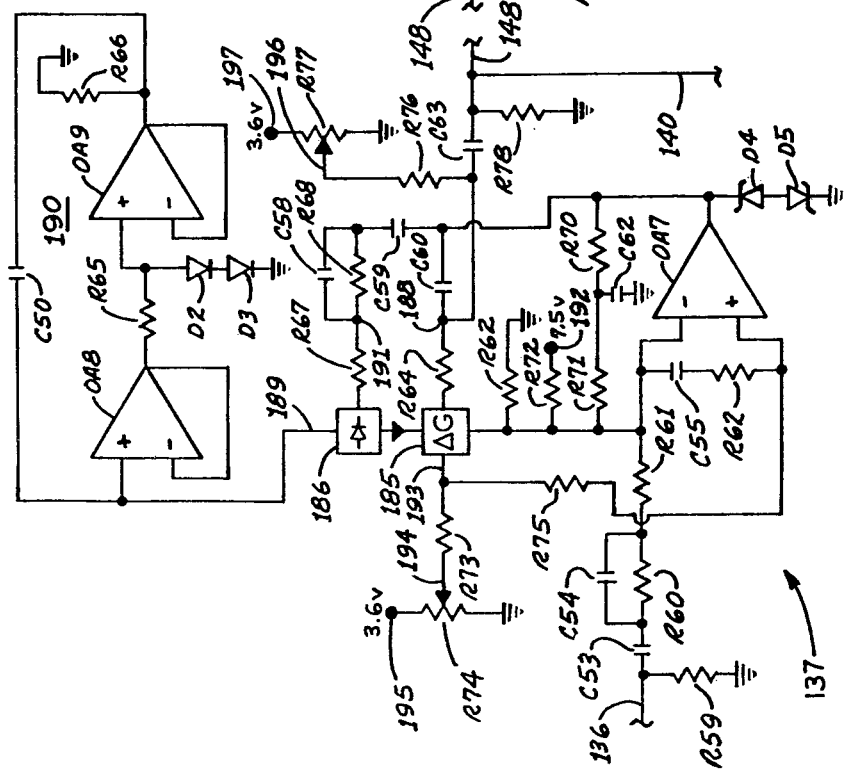
FIG. 8 is a schematic circuit diagram of a secondary dynamic compressor of the system of FIG. 1.

Referring to FIG. 8, which demonstrates the circuitry of the secondary dynamic compressor 137, input lead 134 provides the signal processed by secondary active frequency control 135 across a resistor R59 and through a coupling capacitor C53. The signals are then provided through a high frequency emphasis network comprising a capacitor C54 and resistor R60 to a resistor R61. Said resistor R61 then couples the input signal directly to the inverting input of operational amplifier OA7. The inverting and non-inverting inputs of the operational amplifier are tied together by a series circuit comprising a capacitor C55 and resistor R62. The inputs of operational amplifier OA7 are interconnected with a gain cell 185 and a full-wave rectifier 186, both of which preferably are portions of an integrated circuit compressor expandor i.e., compandor, device such as that commercially available under type designation NE570/571, all as described below.

Such a device may also include an internal or self-contained integrated circuit operational amplifier but, in the case of the preferred compandor circuit NE570/571 employed in the present system, the internal operational amplifier is not utilized. Connections are instead made, as indicated in FIG. 8, to the gain cell 185 and rectifier 186 components of such compandor circuit. Also, there are internal resistive components of compandor device including a resistor R63 which is connected to the output 187 of the gain cell and connected at the opposite end to the circuit ground. A node 188 of the circuit represents the input to the gain cell, there being an internal resistor R64. Gain cell 185 is adapted to be controlled by rectifier 186 in accordance with a capacitor interconnected by a terminal 189 of rectifier 186.

Briefly, rectifier 186 provides full-wave rectification of the audio signal supplied to the input of compressor 137, as reflected at the output of operational amplifier OA7, which output signal, as fed back to the rectifier, is averaged by the capacitance seen at terminal 189. The averaged signal is then provided to the gain cell 185 which in turn provides a gain control signal to the inverting input of operational amplifier OA7.

Normally, a capacitance as provided by a discrete circuit capacitor would be interconnected with said terminal 189. But, in accordance with the present invention, a capacitance expandor circuit 190 comprising operational amplifiers OA8, OA9 is interconnected with rectifier 186. Circuit 190 includes a capacitor C56 which is interconnected between the output of operational amplifier OA9 and the non-inverting input of operational amplifier OA6, which point is also interconnected with the capacitance input 189 of rectifier 186. The inverting input of of operational amplifier is tied directly to its output, which is coupled by a resistor R65 to the non-inverting input of operational amplifier OA9, which input is biased to ground through a pair of diodes D2, D3. A load resistor R66 is connected across the output of operational amplifier OA9.

Also shown interconnected with rectifier 186 is a resistor R67 which is internal to the integrated circuit device type NE570/571 preferred whereby a terminal or node 191 constitutes the input to the rectifier stage. Interconnected with node 191 is a parallel combination of a resistor R68 and capacitor C58 which provide high frequency pre-emphasis for the signal provided to the input of the rectifier. Such input is delivered by a capacitor C59 which is interconnected with the output of operational amplifier OA7. Similarly, a capacitor C60 interconnects this output with the input 188 of the gain cell.

Accordingly, there are interconnected with the output of the operational amplifier two feedback paths, a first being provided to the gain cell 185 through capacitor C60 and resistor R64. A second feedback path is provided through capacitor C59, the pre-emphasis network noted above, and resistor R67 to rectifier 186. The rectifier controls the gain provided by gain cell 185, which is an integrated circuit-realized current in, current out device with the ratio $I_{out}/I_{in}$ controlled by rectifier 186 providing an overall gain which is an exponential function of the input signal. Gain cell 185 equivalently functions as an expandor but, since its output 187 is interconnected with the inverting input of operational amplifier OA7, will be seen to provide, in effect, negative feedback for causing compression of the input signal delivered by input lead 136 to be realized.

Furthermore, since circuit 190 operates to expand the apparent magnitude of capacitor C56 as a function of the relative amplitude range of the signal provided at the output of operational amplifier OA7, the amount of current provided by rectifier 186 to gain cell 185 is varied as a further function of the magnitude, i.e., dynamic range, of the signal being processed.

In addition to the foregoing feedback circuits, a further feedback circuit comprising a pair of resistors R70, R71 is interconnected between the output and inverting input of the operational amplifier, there being a capacitor C62 providing a.c. bypass to circuit ground. Resistors R70, R71 provide d.c. feedback path for operational amplifier OA7 since there is no d.c. feedback path through gain cell 185. A bias potential as provided also to the inverting input of the operational amplifier through a resistor R72 by connection of a terminal 192 to a suitable potential.

In addition, the gain cell is provided with a terminal 193 to be supplied with a THD trim potential or bias which is provided through a resistor R73 connected to the wiper 194 of a potentiometer R74 across which is provided a 3.6 volt d.c. potential by means of a terminal 195. Wiper 194 may be positioned to adjust the THD trim. Terminal 193 is also interconnected by resistor R75 with the non-inverting input of operational amplifier OA7.

D.c. shift trim for the gain cell input 188 is provided similarly through a resistor R75 in accordance with the position of wiper 196 of a potentiometer R76 across which a 3.6 volt d.c. potential is supplied. Upon calibration of the circuitry to provide appropriate THD trim and d.c. shift potentials by positioning of wipers 194, 195, their further adjustment is not required.

In order to limit the output potential of operational amplifier OA7, a pair of back-to-back zener diodes D4, D5 are connected between the output and circuit ground, being selected for threshold potential of, for example, preferably, 3 v. to limit the output of the amplifier and preclude it from exceeding predetermined levels. This limits the output swing to avoid overloading any succeeding circuit stage to which the output of the secondary dynamic compressor circuitry is supplied, such as otherwise may occur if excessive signals caused by ignition or electrical noise, etc. are present in the signals being processed. Thus limited, the output of the operational amplifier is provided through a capacitor C63 to output lead 148, across which there is a load resistor R77.

Accordingly, it is seen that compressor 137 comprises an operational amplifier (OA7) as well as feedback circuitry interconnecting the output and non-inverting input of this amplifier for providing a nonlinearly increasing negative feedback signal to the input in response to increase in the level of the tonally controlled audio signal on input lead 136. Ignoring the change in attack time or response produced by capacitance expandor circuit 190, the signal gain is:

$$G_{comp} = \frac{K I_b^{\frac{1}{2}}}{\overline{V}_{in}}$$

where $I_b$ is the current flowing into an effective internal summing node of operational amplifier OA7, $\overline{V}_{in}$ is the average input voltage of the audio signal input to compressor 137 and K is a gain constant. Gain cell 185 provides an exponential response in gain in response to step changes in amplitude, said exponential response being effected by the time constant resulting from the capacitance represented by circuit 190 at terminal 189 of rectifier 186.

Figure 14:
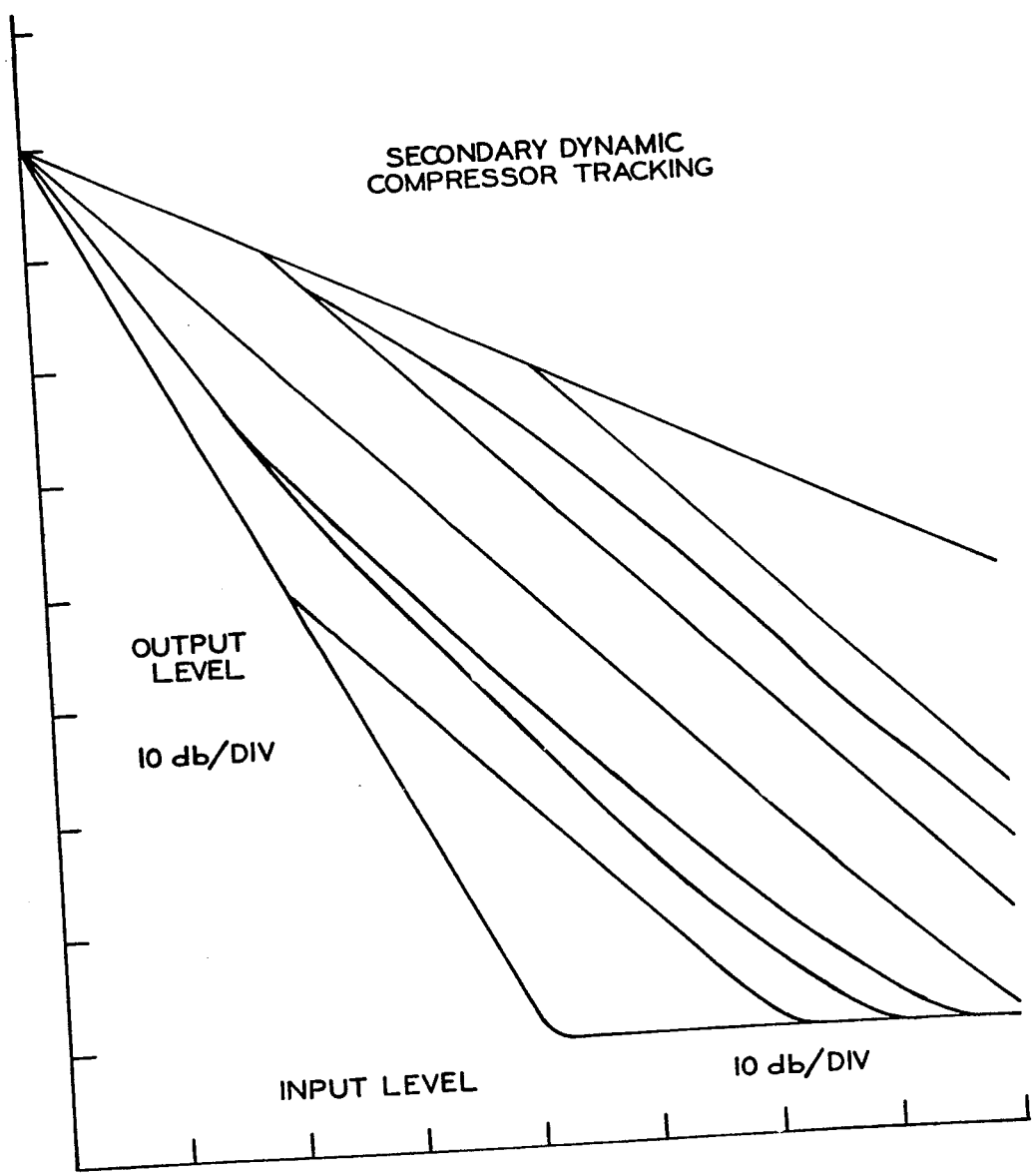
FIG. 14 is a graph of a family of curves illustrating operation of certain compressor circuitry of the invention.

In FIG. 14, family of curves represents typical input-output tracking of compressor 137. The ordinate represents output level and the abscissa represents the input level.

The following table indicates circuit components and nominal values thereof which preferably may be utilized in the construction of the secondary dynamic control circuitry 137 wherein operational amplifier OA7 may be of commercially available type TDA1034 and opertional amplifiers OA8, OA9 may each be of commercially available type LM387:

TABLE II

| R59 | 100 kohm | R67 | 10 kohm |
|---|---|---|---|
| R60 | 62 kohm | R68 | 30 kohm |
| R61 | 20 kohm | R70 | 47 kohm |
| R62 | 22 kohm | R71 | 47 kohm |
| R63 | 30 kohm | R72 | 68 kohm |
| R64 | 20 kohm | R73 | 220 kohm |
| R65 | 1 kohm | R74 | 100 kohm |
| R66 | 1 kohm | R75 | 1 kohm |
| R76 | 220 kohm | C56 | 1 mfd |
| R77 | 100 kohm | C58 | 0.01 mfd |
| R78 | 100 kohm | C59 | 2 mfd |
| C53 | 1 mfd | C60 | 5 mfd |
| C54 | 0.005 mfd | C62 | 10 mfd |
| C55 | 270 pfd | C63 | 5 mfd |

With respect to the operation of the secondary dynamic compressor 137, it may be observed that operation in accordance with the invention involves reconstituting harmonics typically characteristic of himan speech, among other aspects of operation, which harmonics otherwise would be of inaudible and of essentially ineffective amplitude if the audio signal were not processed in accordance with the invention, owing to constraints imposed by normal compression or narrow band filtering normally encountered in modulation and RF transmission systems. Accordingly, it is desired that operational amplifier OA7 be of a relatively high quality character, providing typically a high slew rate and capable of providing transmission of audio frequencies up to at least 15–16 kHz.

Also, in the case of commercial types LM387 utilized for realizing operational amplifiers OA8, OA9, a minimum upper band width is typically 75 kHz although lesser values may be utilized. Thus, the circuitry utilized exhibits high gain and wide bandwidth. For increased stability, in view of these characteristics, an input compensation network constituted by capacitors C53, C54 and resistor R60 is utilized.

Circuit 190 is a gyrator which effectively increases the capacitance at terminal 189, being the apparent magnitude of capacitor C56, in accordance with decrease in signal level, i.e., the dynamic input of compressor 137. Thus, in effect, the response time of the compressor becomes considerably longer at low signal levels, since circuit 190 operates effectively to speed up the compressor attack time at such low signal levels. For example, when the rectifier input level drops from 30 dbm to −30 dbm, the time constant increases from 10.7 $C_{rect} \times 10^3$ to 32.6 $C_{rect} \times 10^3$, where $C_{rect}$ is the effective capacitance interconnected with rectifier 186. This in turn effects the gain cell response because gain cell 185 is controlled by rectifier 186. This avoids or greatly reduces any mistraking of low signal dynamics. Here it is noted that in compressor-expandor (compandor) system in which the overall gain is unity such change in attack time would not produce any overall gain error, and the resultant gain or loss would appear to be manifested as such mistracking of low signal dynamics. But in the present system wherein compression techniques are primarily used, such problem is largely averted, since unity gain is not necessarily provided.

Accordingly, the compressor is operating at high gain when there is a small input signal, but when a higher level input signal is provided to the circuit lead 134, the circuitry operates to effectively reduce the gain. Overloading is, however, precluded even in the case of a large signal supplied to input 134 (as for example, ignition noise) because of the clamping action of diodes D3, D4, D5.

Furthermore, with regard to transient response, it will be observed that the time taken for the compressor to recover from an overload condition is determined by the capacitance interconnected at terminal 189 of the rectifier 186. If there were a smaller capacitor, faster response to transients would be permitted but such would produce more low frequency THD becuase of gain modulation. The use of a relatively small capacitance, i.e., one microfarad for capacitor C56 and circuit C190, avoids such difficulty in the present system. In effect, THD which otherwise would be geherated by the compressor is effectively cancelled by circuit 190.

Moreover, compressor-expandor systems heretofore utilized are subject to a problem known as breathing. This comes about since, as a system is changing its gain, the change in background noise level sometimes can be heard. In order to avoid this problem, capacitor C54 and resistor R60 as well as capacitor C58 and resistor R68 provide high frequency pre-emphasis by altering compression gain accordingly.

In calibrating the circuitry of FIG. 8 for operation, wiper 194 of potentiometer R74 is adjusted for proper THD trim by utilizing a 0 db signal at 10 kHz input audio input signal to the system and will be referenced by meter 145. Also the d.c. trim potentiometer R77 may have its wiper 196 adjusted to provide minimum envelope bounce when inserted tone bursts are applied to the input of the system.

It is preferred that the secondary dynamic compressor circuitry will provide up to 135 db of dynamic compression for a 0 db input signal.

Figure 11:
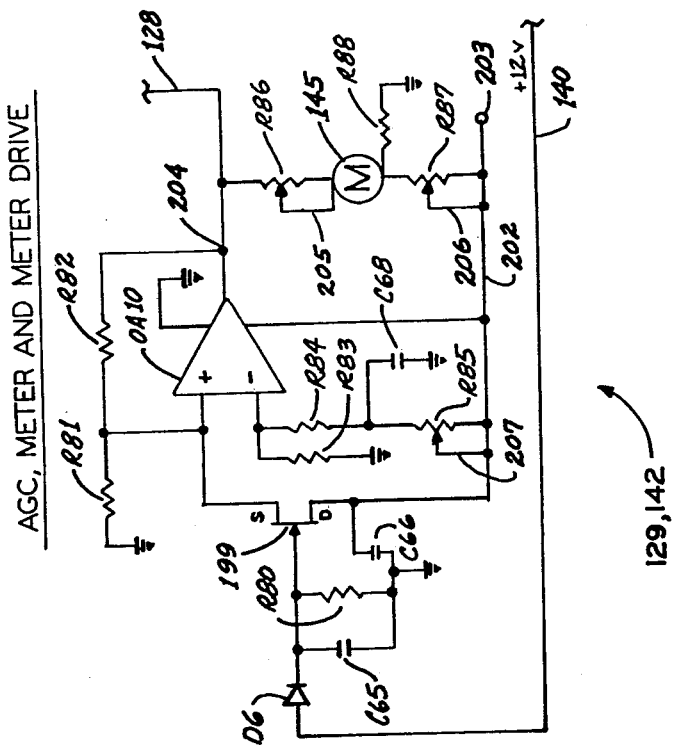
FIG. 11 is a schematic circuit diagram of circuitry of an automatic gain control as well as meter drive circuitry and a meter for indicating operation performance of the system of FIG. 1.

Referring now to FIG. 11, the automatic gain control (AGC) circuit 129 is shown. Lead 141 provides an input for the audio frequency signals processed by the secondary dynamic compressor 137 whose output effectively provides a tracking voltage provided by feedback circuit to the d.c. rectification stage, i.e., rectifier 186 and expandor circuit 190, of the secondary compressor 187, while serving also to deliver the processed audio signals to bandpass output filter 152. This AGC input is supplied to a diode D6 for rectification and thence to the gate of a field effect transistor (FET) 199. Connected between the gate and drain electrodes thereof is a time constant delay circuit for providing a delayed action of the AGC circuitry and comprising a capacitor C65 in parallel with a resistor R80, both connected at one end to the circuit ground, and a capacitor C66 having one end connected to the drain electrode of the FET.

The FET effectively isolates the input by its high impedance, being adapted by change in its conductivity to change the level of a signal applied to the non-inverting input of an operational amplifier OA10, which input is biased to ground through a resistor R81 and interconnected to the output of the operational amplifier for feedback purposes through a resistor R82 thereby to establish control over the gain of the latter.

The inverting input is biased to ground through a resistor and is connected through a resistor R84 and potentiometer R85 having its opposite end and a wiper 201 tied to a lead 202 which is supplied by a terminal 203 with positive voltage, i.e., 12 v.d.c., whereby the gain of the operational amplifier may be controlled by the setting of wiper 201. Further, a bypass capacitor C68 couples to ground any AC component present on lead 202. Lead 202 is shown interconnected with the lead 203 for supplying the operational amplifier with its operating voltage.

Connected between 202 and the output 204 of the operational amplifier is a circuit comprising a pair of potentiometers R86, R87 and meter 145, which is preferably of the moving coil type. The output 204 is tied directly to lead 128 for providing an AGC feedback connection to the primary voltage compressor 127. One side of the meter 145 is connected to ground through resistor R88. Wipers 205, 206 of potentiometers R86, R87 provide calibration of the meter.

The meter indicates the overall signal compression gain level and thus displays an indication of the extent to which the system is being utilized to capacity. The meter is of the moving coil type, providing averaging of the instantaneous variations in the output of operational amplifier OA10 to avoid wildly fluctuating changes in the indicated output which would be difficult to observe.

For proper operation, Wiper 201 is adjusted to permit variation in the level of voltage provided to the inverting input of the operational amplifier within a normal swing or variation in the potential at output 204 of from about 2 to about +9 v.d.c., which potentials are of the proper magnitude for the primary voltage compressor 127.

There is thus provided a feedback signal to the primary voltage compressor from the automatic gain control 129 in accordance with the extent of compression by secondary dynamic compressor 137. As a consequence, a negative or limiting feedback occurs which operates to provide the function of controlling the amount of THD to provide the function of controlling the amount of THD by limiting the primary voltage compression as a function of the compression provided by the secondary compressor 137. Thus, not only does the feedback serve to control overall dynamic compression but there is also a control of the bandwidth of the system by limiting out-of-band harmonics which would otherwise pass through the system as a result of THD.

For certain applications of the invention, one might permit rapid secondary reaction, so that the feedback to the primary compressor 127 would operate to prevent an overload resulting from excesses in the output of the secondary dynamic compressor 137, thus avoiding overdriving of the output. For example, digital signals of the type involved in data transfer might require such rapid reaction. Also in the case of data transmission, rather than voice transmission, narrow bandwidths are involved so that one need not provide capacity for handling harmonics normally present in speech or other audio.

The amount of delay which results in the AGC delay path is preselected in accordance with applications of the system and the type and character of signals to be processed.

Variation of the AGC time constant are provided by capacitor C65 and resistor R80 which may be varied, as by selection of different components. Of course, conventional multiple switches may be used to permit capacitances and resistances of various values to be substituted for capacitor C65 and resistor R80. Examples of the AGC delay which may be provided by capacitor C65 and R80 are from 0.010 seconds to 3 seconds, as a broadly preferred range, whereas typically a delay of 0.3–0.5 seconds may be adequate for various types of audio signals. In general, the delay is to be shorted, i.e., for faster response for transmission of signals of the date character and slower such as 0.3–0.5 seconds or even longer for signals of audio or voice character. In this way, the amount of AGC feedback can be established in direct relevance to the amount of out-of-band harmonics expected to be present in the signals being transmitted.

As noted above, an LED device circuit 149 and LED 150 of the circuit configuration shown in FIG. 10 is also connected to the output 148 of secondary dynamic compressor 137 thereby to indicate the amount of compression attained by compressor 137. In this regard, the LED 150 is utilized to signal an overload condition resulting from excessive compression. Thus, for a normal 0 db input, i.e., 120 db compression, the control of the system may be adjusted to provide operation under conditions such that peak compression can be handled, as indicated by elimination of LED 150 during processing of audio signals, the controls being adjusted to prevent LED 150 from normally remaining illuminated.

Figure 9:
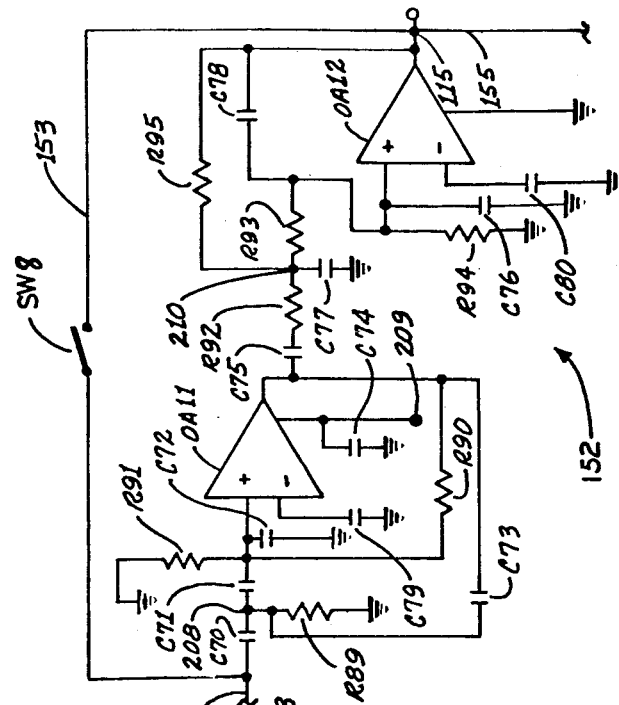
FIG. 9 is a schematic circuit diagram of a bandpass output filter of the system of FIG. 1.

The output of the secondary dynamic compressor 148, as thus monitored, is provided to bandpass output filter 152, the circuitry of which is shown in FIG. 9.

Referring to FIG. 9, an operational amplifier OA11 receives thus processed audio frequency signals through a pair of capacitors C70, C71. The non-inverting input to which the signal is supplied is also biased to ground through capacitor C72. A node 108 between capacitors C70, C71 is biased to ground through a resistor R89 and also is provided through a capacitor C73 with a feedback signal provided by the output of the operational amplifier. A further feedback path is provided through a resistor R90 directly to the non-inverting input, which is biased to ground through a resistor R91. The inverting input is connected to circuit ground through capacitor C74. A terminal 209 is provided for providing d.c. operating voltage for the operational amplifier OA11 as well as a further operational amplifier OA12, the two being both preferably part of the same integrated circuit such as that commercially available under type LM387. The power supply terminals connected to ground through a conventional bypass capacitor C74.

The output of operational amplifier OA11 is coupled through a capacitor C75 and resistors R92, R93 to the non-inverting input of an operational amplifier OA12. The latter input is biased to ground through a resistor R94 and also through a capacitor C76. Feedback for operational amplifier OA12 is provided first by resistor R95 which is connected between the output and a node 210 between resistors R92, R93. This node is coupled to ground through a capacitor C77. Feedback is also provided directly to the non-inverting input through a capacitor C78. The inverting input of operational amplifier OA12 is connected to ground through a capacitor C80. The output of operational amplifier OA12 constitutes the output of the bandpass output filter.

Thus, there is provided a bandpass output filter having high frequency and low frequency sections and preferably providing low frequency gain of 22 db with the low frequency upper 3 db corner at 30 Hz and with the high frequency upper 3 db corner at 10 kHz. It is emphasized that bandpass output filter 152 is adapted for providing a considerably greater pass band than that of bandpass input filter 119. Selection of component values to achieve these corner frequencies and pass band characteristics as described above will be apparent to those skilled in the art.

As previously observed, a switch SW8 is connected in a lead 153 which extends from the input 148 to the output 115 of the bandpass output filter and, when closed, switch SW8 thus directly connects the input to the output for bypassing the bandpass filter, just as input bandpass may be desired for testing or specialized purposes of the invention, or when processing narrow band signals which do not require filtering before or after processing. Lead 155 supplies the output of bandpass output filter 152 to the high level output stage 156, which is shown in FIG. 13.

Figure 13:
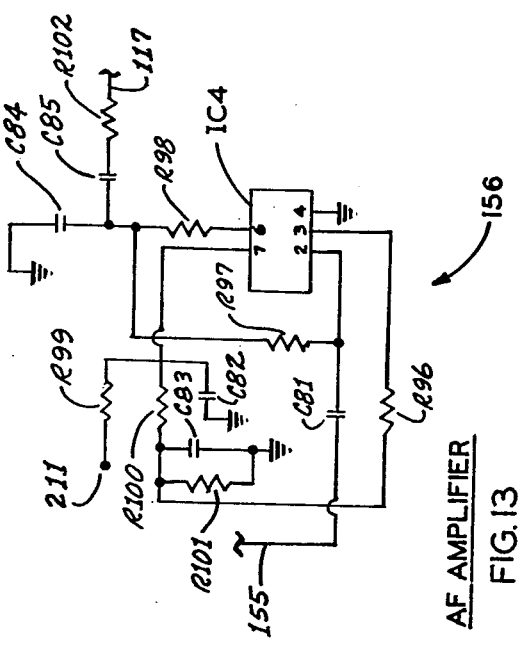
FIG. 13 is a schematic circuit diagram of an audio frequency amplifier utilized in the system of FIG. 1.

Referring to FIG. 13, lead 155 provides the processed audio frequency signal through a coupling capacitor C81 to the input terminal of an integrated circuit amplifier IC4 is interconnected with the following components having nominal values as indicated:

TABLE III

| R96 | 1 kohm | R102 | 1 kohm |
|---|---|---|---|
| R97 | 820 kohm | C81 | 0.1 mfd |
| R98 | 100 kohm | C82 | 15 mfd |
| R99 | 560 kohm | C83 | 25 mfd |
| R100 | 47 kohm | C84 | 0.01 mfd |
| R101 | 47 kohm | C85 | 1 mfd |

A terminal 211 is provided for supplying operating voltage, e.g., 12 v.d.c., through resistor R99 for powering the integrated circuit IC4. Amplifier circuit 156 operates in effect to provide a buffering of the output 115 and for providing high level, e.g., with 40 db gain, useful for driving various auxiliary apparatus, such as oscilloscopes, monitor displays, frequency counters, spectrum analyzers, and the like.

Audio Frequency Amplification

Audio amplifier 70 provides relatively low level amplification to provide adequate signal levels for audio processing and to ensure that processed signals are provided to instrument 20 at levels typical of telephone systems.

Figure 15:
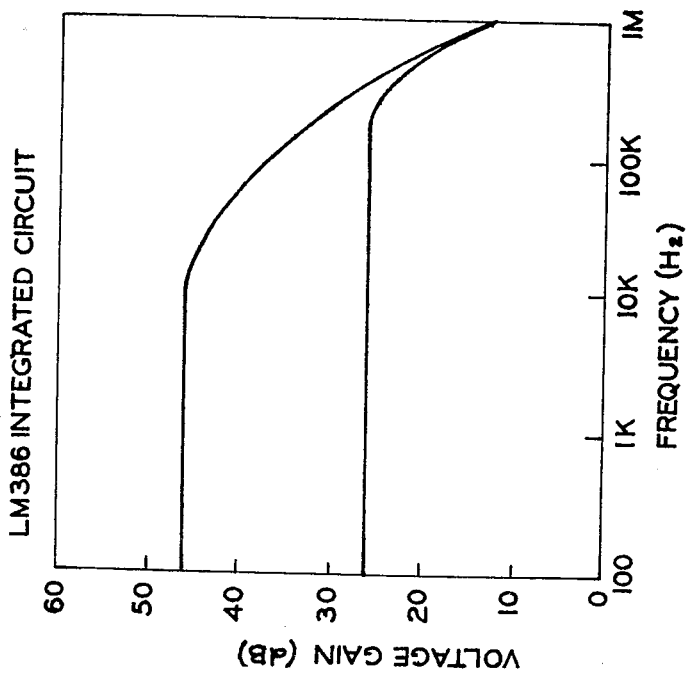
FIG. 15 is a graph of a family of curves illustrating the operation of certain amplification circuitry of the invention.

FIG. 15 is plot of the voltage gain of circuitry of audio amplifier 70 as a function of frequency showing two different representation gain curves, and thus serving to illustrate the frequency response of audio amplifier 70.

Audio amplifier 80 similarly exhibits broad frequency response. It has a capability of delivering substantial power gain, e.g., several watts to enable the system to present to transmission line 40 a signal of level adequate for telephone transmission over a balanced 600 ohm line pair, e.g., to present a zero db 0.775 vrms signal even at low levels of input.

Voice-Operated Switching

VOX circuit 60 may take any of various forms which are within the design skill of ordinarily skilled circuit designers or may be of a circuit arrangement known in the art, it being required that such circuit procude switching action upon the initiation and continuation of voice signal input to instrument 20. In one preferred form of VOX circuit, a speech-compression preamplifier realization of a commercially available type LS370 integrated circuit differential operational amplifier may provide a voltage output for electronic switching of the system from a receiving to a transmitting mode. Such circuitry includes an audio output of the operational amplifier which is gain controlled to provide a level for proper audio processing and for proper modulation.

Modulation-Demodulation

AM modulator-demodulator 50a is preferably of conventional design such as known within the art, employing a peak detector for demodulation of the audio from conventional IF signals, e.g., at 455 kHz, as may result from down-conversion of VHF AM signals.

FM modulator-demodulator 50b may preferably be a narrow band type employing a quadrature demodulator in a balanced-mixer circuit of conventional design useful for limiting bandwidth operation to ±5 kHz duration.

For SSB modulator-demodulator 50c (which preferably also constitutes a CW demodulator), a balanced mixer may be used as a productor detector.

If desired, a carrier generator may be part of the system for supplying RF signals to the modulator portions of circuits 50a, 50b, 50c.

Input and output ports permit the coupling of signals to and from lines L12a–L12c and L13a–L13c for interconnection with coaxial transmission lines.

Commercially available integrated circuit devices of type families LM273 and LM274 may be employed for the realization of AM, FM, SSB, CW detection circuit associated with the modulation-demodulation portions of the system as described above.

General Construction and Interpretation

In the interest of clarity, not all of the various conventional power supply or similar connections of the present system have been necessarily illustrated. In some cases, discrete integrated circuits as well as discrete components are utilized. But it should be understood that some or all of the circuit devices of discrete commercial types such as those described may be replaced by circuitry involving large scale integration (LSI) or very large scale integration (VSLI). Also, certain analog processing circuitry may be supplemented, augmented, etc. by digital processing circuitry.

Additionally, it is noted that in describing the preferred embodiment, specific terminology has been utilized for the sake of clarity. However, it is not intended to limit to the specific terms so selected and hence it is to be understood that each specific term includes all technical equivalents which operate in a similar or functionally homologous or synonymous manner to accomplish a similar or equivalent purpose. For example, the term "interconnected" or "connected" is not limited to a meaning of directly connected but rather includes indirect connection or connection through intervening components. Also, the term "series" or various expressions such as "series circuit", "series connected", and the like are all to be construed as describing only the generalized attribute of a circuit path, branch, or network, rather than to mean that the same current necessarily must pass through each element so described. Accordingly, if terminals of the plurality of the elements of the present circuitry form a path between two circuit nodes, they may for convenience of reference be said to be in series even though other elements may have a connection to intermediate nodes of such path.

In the implementation of the invention, the circuit blocks may individually or in combination be assembled on printed circuit boards (PCB's) of standard size, if desired, and may be assembled in cabinetry. The various modules and blocks of FIGS. 2 and 3 may be provided separately or in a combination of PCB's of the type having an arrangement of contacts along an edge for being mated to a so-called "mother" board or main frame.

Although references have been made herein to cycles per second, or Hertz, data may be processed by circuitry of the invention. Thus, bit or pulse rates, as measured conventionally in band or as bits per second, etc., are to be understood as included within such references.

Operational Configuration and Operation

Referring to FIG. 16, a system of the invention constructed as hereinabove described, and generally as shown in FIG. 1, is connected to provide a processing and transmitting facility A having an audio transmitting facility a, audio processing circuitry b and an appropriate terminal facility c. The latter may be part of a telephone system, or part of an RF transmitting system. Facility A is shown representatively connected by a communication transmission line (which may or may not include an RF link or links) to a corresponding processing and receiving facility B having a receiving terminal facility c', audio processing circuitry b and an audio receiving facility a'. Thus, identical audio processing circuitry is used in both facilities A and B. Simplex transmission of signals occurs, and both the transmitted and received audio signals are preferably processed in accordance with the invention. However, audio processing according to the invention may, under some circumstances, not be able to be provided at both ends of such a simplex transmission system, even though otherwise desirable.

FIG. 17 illustrates use of systems employing the invention for duplex transmission. Thus, at one end of the transmission line, or lines, are a processing and transmitting facility A and processing and receiving facility B. Corresponding facilities A' and B' at the opposite end permit simultaneous two-way communications. The facilities are constructed as in FIG. 16 and specifically as previously described.

Regardless of whether simplex or duplex communication is to be carried out, the system shown in FIG. 3 is connected as a part of the system where it is desired to utilize the system for processing audio signals provided by an audio source. In this regard, the source may be at either end of the line transmission link. Thus, if the source may be the intermediate amplification stage of a modulation system providing an audio signal to modulate a line signal such as AM, FM, SSB, etc., the system may be utilized for improving intelligibility and clarity of such audio signals utilized for modulation thereby to improve the character of the line transmitted information even though such may be in a relatively narrow band, such as 3 kHz or less or the source may be the intermediate amplification stage of a line transmission receiver which amplifies a demodulated audio signal, which similarly may be of a very limited bandwidth as received, so as to retrieve from the received modulated audio signals clarity and intelligibility and general characteristics of normal human voice or other tonal signals. In such uses, the system enhances the character of the signals transmitted or received to achieve the various objects of the invention.

When audio processing of the invention is utilized at each end of a line transmission, the two audio processing facilities of the invention effectively multiply the phenomena produced by a single processing facility on either end of such a link. When utilized on both ends, the system in effect provides what is most closely analogous to a compressor-expandor phenomena in view of the fact that the system as thus utilized to process both the transmitted and received audio information adds substantial dynamic range as well as improves the signal to noise (S/N) ratio. But in the strict sense, the system is not merely a compressor-expandor (compandor) since a compandor is a combination of a compressor at one point in a communication path for reducing the amplitude range of signals followed by an expandor at another point for complementary increase in the amplitude range for increasing S/N ratio.

Regardless of its use in one of the type of situations referred above, and as more fully contemplated in accordance with the objects of the invention and as described hereinabove, the new system provides overall performance which goes well beyond that of a compandor in a customary sense since it not only improves S/N ratios but also reconstitutes lost harmonics and improves clarity, intelligibility and generally enhances the character of signals processed therethrough. Without use of the new system, the usually audible characteristics of human speech involving various harmonics particularly of the higher order which give life-like, normal character as well as richness and quality to human speech are typically so suppressed or reduced in magnitude in narrow band transmission as to deprive the received voice signals of character and intelligibility. The processing of audio signals by the invention involves effective reconstitution of these various harmonically related attributes of speech so that the processed audio has a richness characterized by the presence of out-of-band harmonics which have been returned to the processed audio, producing normal life-like intelligibility of the audio signal, particularly speech.

Effectively, one may think of the operation of the system as first involving the pulling out or limiting certain out-of-band harmonics which normally would be present in signals amplified, and then subsequently returning such harmonics to the signal in such a way that they are emphasized to advantage. One may liken the system to the use of a crystal oscillator circuit which, through ringing, may be utilized to create harmonics. In this analogous way, the system returns harmonics of human speech to audible levels of fundamental frequency. This manifestation is not well understood, but is an attribute of such significance that it is best appreciated only upon objective aural comparison between signals from various sources processed, and those not processed, through use of the invention.

In a practical embodiment of the invention, the user can be provided with ready panel-front access to gain control potentiometer R9 for variation of the wiper 159 thereof to control the level of signals provided to the primary active frequency control circuit 123. Also, the user can be provided with controls for varying the position of potentiometer wipers 161 and 165 to preselect the amount of gain within the low and high frequency portions of primary active frequency control 123 in accordance with the type of signal to be processed. In addition, the wipers for tone control potentiometer R48, R51 can be controllable by the user to preselect the response of secondary active frequency control circuit 135. Front panel accessibility can further be provided for controlling the wiper of potentiometer of R61 to allow selective response not only of the overall gain provided by the secondary dynamic compressor operational amplifier OA7 but also for controlling THD during operation of the secondary dynamic compressor 137. Of course, as noted above, switches SW7, SW8 are also located for operator usage to permit selective use of the bandpass input and output filters 119, 152. Additionally, meter 145 is located for being observable by the user.

The circuit values of the LED drive circuits 131, 149 are each chosen to provide for energization of the respective LED 133, 150 when the output of the compressor 127, 137 respectively interconnected with each drive circuit is providing maximum compression. Thus, by referring to LED 133, the operator may provide adjustment of primary active frequency control gain potentiometer R9 to allow the output of the primary voltage compressor 127 to reach its full maximum value, as indicated by illumination of LED 133. This LED will remain unlit when primary compressor 127 is operating at less than full compression. The user may thus appropriately adjust the overall system gain to allow normal operation to proceed so that LED 133 would only light upon maximum peak magnitude of signals being processed. Similarly, potentiometer wiper 184 of the secondary dynamic compressor 137 is adjusted so that LED 150 normally will remain unlit but will flash momentarily only at maximum peak signal levels.

The user is continuously provided by meter 145 with an indication of the extent to which the system is operating to the extent of its capabilities thus displaying the overall performance of the system.

In conjunction with the use of meter 145, it is noted that its indication when speech signals are being processed by the system is such as to give a visual indication of the averaged output voltage of secondary compressor 137, but at the same time the meter will indicate fluxation in dynamic audio content. This indication is particularly useful when speech is being processed through the system. However, it is noted that when data signals are processed through the system such as in the case of facsimile or teletype signals, meter 145 produces only an average reading from any given dynamic fluxation pattern, since dynamic voltage peaks will appear far too fast to be tracked by the moving coil type of movement of meter 145. On the other hand, the indication provided by LED 150 is such that any rapid increase in signal which may be in excess of the maximum compression utilizable will be instantaneously displayed by flashing of the LED.

It is, therefore, seen that the system is provided with the minimum of control as well as relatively simple, easily understood indications for properly monitoring its operation and determining performance. Additionally, by virtue of its IC circuitry, the system is easily housed in a compact, small lightweight enclosure or cabinet and may, if desired, be battery powered to provide complete portability as well as long periods of operating time.

Telephone Voice Applications

With regard to the previously mentioned practical applications of the invention with telephone line systems, it should be realized that circuitry of the invention will work equally as well with antiquated PBX systems as with the most highly sophisticated computerized trunk call systems. Actually, audio processing phenomena of the invention would be far better realized on an antiquated system than with a modern telephone system because the dynamic increase in intelligibility and sustinction of speech will be far more noticeable on these aforesaid systems as no type of processing is normally applied. The improvements over conventional or standard compandor systems presently utilized are self-evident if the operation of audio processing circuitry of the invention is understood as all the enhancement qualities of a system of the invention while working in an RF communications mode would be present and transferred to a landline when the system is interfaced with a telephone line system. Due to the new system's effectiveness, the invention can be used to update antiquated exchanges for long distance communications without the expense of using conventional multiple inline compandor systems and filtering techniques, since the inherent qualities of the new system would provide the benefits of the latter conventional approach in general operating conditions.

Data Communications

Utilizing the new system, digitized information can be passed over a standard narrow band telephone line to an extent previously regarded as either impractical or impossible. Such information may typically be high speed data such as characteristic of computer links. With the bandwidth available, this information can be sent at higher rates than previously practical. Other applications include mixed communications wherein voice characterization as well as quality are required, such as live broadcast reporting where distinction as well as good definition in voice character are required. In the field of data communications where multiple repeater and landline operation are used, the new system can be utilized for both radio transmission and landline transmission to achieve extremely high levels of intelligibility.

Frequencies of Signals Processed and Terminology

Because a system of the invention is primarily intended to provide processing of any of various signals transmitted by line systems (which may, as noted, include RF links) wherein the intelligence is conveyed by voice or data at frequencies corresponding to a normally audible sound wave, and typically within the audible spectrum of 15–20,000 Hz, the terms "audio frequency" or "audio signals" have been employed. However, it is to be understood that principles of the invention may be employed in the design and operation of circuitry for processing signals greater than 20,000 Hz, including those of frequencies or bit rates typically regarded as radio frequencies. Therefore, such terms as "audio frequency signals", etc., are not to be construed as limiting.

Since, regardless of frequency, "audio processing" may occur either before or after transmission, with respect to a system of the invention configured only for processing of signals received after transmission, the term "unprocessed signals" is used to denote signals received but not yet further processed by processing circuitry of the invention, even though such signals may already have been processed before transmission Therefore, circuitry of the invention may be used to process "unprocessed" audio frequencies before transmission of the now-"processed" signals. The received signals, while improved, may be regarded as "unprocessed" at the receiving end, where processing circuitry of the invention may again provide "processed" signals which are, thus, doubly processed without contradiction in terms.

Modifications

Although the foregoing includes a description of the best mode contemplated for carrying out the invention, various modifications are contemplated.

For example, it is within the purview of the invention to allow the compression levels of the various circuits to be varied as well as to allow the compression circuitry of the invention to be operated in an expansion mode for increasing, rather than decreasing, dynamic range, as may be desirable. When circuitry of the system is utilized in such mode, high frequency de-emphasis may be utilized in the system wherein expansion occurs to compensate for high frequency pre-emphasis which is normally performed by secondary compressor 137 in the system presently configured.

As various modifications could be made in the constructions herein described and illustrated without departing from the scope of the invention, it is intended that all matter contained in the foregoing description or shown in the accompanying drawings shall be interpreted as illustrative rather than limiting.

What is claimed:

1. For use with a transmission line over which signals may be transmitted in either of opposite directions, a signal transfer and processing system comprising interface circuitry and processing circuitry, said processing circuitry comprising signal input means for receiving a line transmissible input signal to be processed, and signal output means for providing a processed signal for further use, characterized by primary dynamic control means for dynamically compressing the input signal thereby to provide a primarily compressed signal, frequency level control means for selectively controlling the relative amplitude of said primarily compressed signal within different frequency bands, thereby to provide a frequency controlled dynamically compressed signal, secondary dynamic control means for dynamically compressing said frequency controlled primarily compressed signal, thereby supplying a secondarily compressed signal, and feedback means providing between said primary and secondary dynamic control means feedback for limiting the dynamic compressing of said input signal as a function of increase in the level of said secondarily compressed signal, said signal output means providing said secondarily compressed signal as said processed signal, said interface circuitry comprising signal responsive circuitry which is responsive to the direction of signal transmission on said transmission line of signals to be processed, said signal responsive circuitry being operative to cause interconnection of said processing circuitry with said transmission line for causing signals transmitted over said transmission line to be automatically directed through said processing circuitry thereby to produce processing of such signals.

2. A signal transfer and processing system according to claim 1 and further characterized by said signal responsive circuitry being operative automatically for alternatively routing incoming and outgoing signals through said processing circuitry in accordance with whether the signals transmitted over said transmission line are incoming or outgoing.

3. A signal transfer and processing system according to claim 2 and further characterized by said interface circuitry comprising line amplifier means for selective amplification of incoming or outgoing signals, and first switching means for selectively providing routing of said incoming and outgoing signals through said processing line amplifier means.

4. A signal transfer and processing system according to claim 2, said incoming and outgoing signals being voice signals of audio frequency and further characterized by said signal responsive circuitry comprising voice actuated switching means responsive to the presence of outgoing voice signals for causing said switching means to switch outgoing signals through said processing means and responsive to the absence of outgoing voice signals for causing said voice actuated switching means to switch incoming signals through said processing means.

5. A signal transfer and processing system according to claim 2 wherein incoming or outgoing signals are modulated RF energy and further characterized by modulator-demodulator means for demodulating incoming signals and modulating outgoing signals, and further switching means providing routing of said incoming and outgoing signals through said modulator-demodulator means.

6. A signal transfer and processing system according to claim 2 and further characterized by said transmission line being a telephone line, said incoming and outgoing signals being of audio frequencies, said signal responsive circuitry providing connection of a telephone facility to said telephone line for processing of audio frequency signals transmitted to or from said telephone facility via said telephone line.

7. A signal transfer and processing system according to claim 6 and further characterized by said processing means being high impedance and impedance matching means for matching said high impedance to intrinsic low impedance of said telephone line.

8. A signal transfer and processing system according to claim 1 and further characterized by said secondary dynamic control means including means for effecting compressing of said frequency controlled primarily compressed signal at a delayed response time which is a function of the level of the last-said signal.

9. A signal transfer and processing system according to claim 8, said secondary dynamic control means comprising a differential operational amplifier having inverting and non-inverting differential inputs and a single output providing an output signal which is a function of the differences between signals applied to said differential inputs, gain control feedback circuitry interconnecting the output and inverting input including a gain cell adapted for providing a gain control signal to said inverting input for reducing gain with increase in the signal level at said output, rectifier means for averaging the signal provided to said secondary dynamic control means, said recitifier means controlling said gain cell as a function of the average of said signal thus provided, said rectifier including an averaging capacitance and capacitance expandor means for electronically expanding the effective magnitude of said capacitance to alter compression attack time for low levels of said signal thus provided.

10. A signal transfer and processing system according to claim 9 and further characterized by said capacitance expandor means comprising a circuit including a fixed capacitance and active amplifier means for equivalently magnifying said fixed capacitance, said capacitance expandor means comprising at least one operational amplifier having a non-inverting input and an output, said fixed capacitance being connected between the last said input and output.

11. A signal transfer and processing system according to claim 1 and further characterized by said first and second dynamic control means each comprising a differential operational amplifier having inverting and non-inverting inputs and a single output providing an output signal which is a function of the differences between signals provided to the last-said inputs, said inverting input receiving a respective signal, means for supplying a reference voltage to said non-inverting input, a first feedback circuit path between said amplifier output and inverting input including a rectification circuit for rectifying current in said feedback path, a capacitance interconnected with said rectification circuit for averaging the rectified current, a second feedback circuit interconnecting said amplifier output and said inverting input including a gain cell, interconnected with said rectification circuit, for increasing the gain of the signal at said amplifier output to provide a gain-increased feedback signal to said inverting input which is an exponential function of the average of said rectified current, and a DC feedback circuit interconnecting said amplifier output and inverting input and including resistance for controlling the gain of said operational amplifier.

12. A signal transfer and processing system according to claim 1 and further characterized by primary frequency level control means for selectively controlling the relative amplitude of said processable signal within different frequency bands, the first-said frequency level control means constituting a secondary frequency level control means.

13. A signal transfer and processing system according to claim 12 and further characterized by said primary and secondary frequency level control means each providing controlling of the relative amplitudes of signal within at least low and high frequency bands, the high frequency band of said secondary frequency control means having a cutoff value much greater over that of the high frequency band of said primary frequency level control means, whereby the bandwidth of the secondary frequency level control means is much greater than the bandwidth of the primary frequency level control means.

14. A signal transfer and processing system according to claim 12 and further characterized by said primary and secondary level frequency control means each comprising a plurality of active amplifier means for selectively amplifying signals of a respective frequency band, and means for selectively controlling the gain of the active amplifier means with each said frequency band.

15. A signal transfer and processing system according to claim 1 and further characterized by an output bandpass filter, associated with said signal output means, for filtering said secondarily compressed signal and providing a pass band of not greater than about 3 kHz for limiting the bandwidth accordingly of said processed signal, and an input bandpass filter, associated with said signal input means, for filtering said processable signal and providing a pass band of not greater than about 3 kHz for limiting the bandwidth accordingly of said processable signal.

16. A signal transfer and processing system according to claim 1 and further characterized by said feedback means comprising amplifier means having an input interconnected with an output of said secondary dynamic control means for providing an automatic gain control voltage representing the output level of said secondarily compressed signal, said primary dynamic control means including a gain cell and amplifier means controlled by said gain cell for providing compression, said gain cell having an input and means interconnecting the output of said amplifier means with the gain cell input said primary dynamic control means for limiting compression gain of said primary dynamic control means.

17. A signal transfer and processing system according to claim 16 and further characterized by said feedback means including circuit means for providing a time-delayed unipolar signal to said amplifier means thereof derived from said secondarily compressed signal.

18. A signal transfer and processing system according to claim 1 and further characterized by display means interconnected with said secondary dynamic control means for providing an averaged indication of the level of said secondarily compressed signal.

19. A signal transfer and processing system according to claim 1 and further characterized by first and second display means respectively interconnected with said primary and secondary dynamic control means for indicating a peak level of dynamic compression thereof.

20. For use with a transmission line over which signals may be transmitted in either of opposite directions, a signal transfer and audio processing system comprising interface circuitry (30) and audio processing circuitry (100), said processing circuitry comprising audio input means (113) for receiving an audio signal to be processed, and audio signal output means (115) for providing a processed audio signal for further use, characterized by input bandpass filter means (119, SW7), associated with said audio input means, for filtering said audio signal to be processed to selectively limit bandwidth thereof, primary active frequency level control means (123) for selectively controlling the relative level of the audio signal provided from said primary bandpass filter means (119) for selectively controlling the relative amplitude of audio signal components within a plurality of different audio frequency bands thereby to provide a frequency controlled signal, primary dynamic control means (127) for dynamically compressing said frequency controlled signal thereby to provide a primarily compressed signal, secondary active frequency level control means (135) for selectively controlling the relative amplitude of said primary compressed signal within a plurality of different audio frequency bands thereby to provide a frequency controlled primarily compressed signal, secondary dynamic control means (137) for dynamically compressing the last-said signal, thereby supplying a secondarily compressed signal, feedback means (128, 129, 140) interconnected between said primary and secondary dynamic control means for limiting the dynamic compressing by said primary dynamic control means as a time-delayed function of increase in the level of said secondarily compressed signal, output bandpass filter means (152, SW8), associated with said audio output means, for filtering said secondarily compressed signal to selectively limit bandwidth thereof, said output means providing the last-said signal provided by said output bandpass filter means as said processed audio signal, said interface circuitry including signal responsive circuitry which is responsive to the direction of signal transmission over said transmission line, and switching means adapted to be actuated by the signal responsive circuitry for providing interconnection of said audio input and audio output means of said audio processing circuitry with said transmission line for causing audio frequency signals transmitted over said transmission line to be automatically directed through said audio processing circuitry thereby for processing thereof.

21. A signal transfer and processing system according to claim 20 and further characterized by said switching means comprising switching devices (RL1a, RL1b, RL13a, RL3b, RL4) for routing incoming and outgoing audio frequency signals transmitted by said transmission line to be selectively directed through said audio processing circuitry, and said signal responsive circuitry comprising voice responsive circuitry (60) responsive to the presence of outgoing signals for causing said switching devices to route outgoing signals through said processing means and alternatively responsive to the absence of outgoing audio signals for causing said switching devices to route incoming signals through said audio processing circuitry.

22. A signal transfer and processing system according to claim 20 and further characterized by said transmission line being a telephone line.

23. A signal transfer and processing system according to claim 20 and further characterized by said secondary dynamic control means including a capacitance controlled gain cell (185) and capacitance expandor means (190) for varying an effective capacitance controlling said gain cell to effect compressing of said frequency controlled primary compressed signal at a response time which is a function of the level of the last-said signal, said capacitance expandor means comprising a fixed capacitance (C50) and active amplifier means (OA8, OA9, 90) for equivalently magnifying said fixed capacitance to provide said effective capacitance of increasing value as a function of decrease in the level of the last-said signal, said feedback means providing a time-delayed feedback signal to said primary dynamic control means with a time constant within the range of from 0.01 to 3 seconds.

* * * * *